United States Patent [19]
Shimizu et al.

[11] Patent Number: 5,472,906
[45] Date of Patent: Dec. 5, 1995

[54] METHOD OF FORMING ISOLATION

[75] Inventors: Norisato Shimizu; Yasushi Naito; Yuichi Hirofuji, all of Osaka, Japan

[73] Assignee: Matsushita Electric Industrial Co., Ltd., Kadoma, Japan

[21] Appl. No.: 291,914

[22] Filed: Aug. 18, 1994

Related U.S. Application Data

[63] Continuation-in-part of Ser. No. 162,959, Dec. 8, 1993, abandoned.

[51] Int. Cl.$^6$ ................................................. H01L 21/76
[52] U.S. Cl. ................................................. 437/72; 437/69
[58] Field of Search ............ 437/72, 69; 148/DIG. 117, 148/85, 86

[56] References Cited

U.S. PATENT DOCUMENTS

| | | | |
|---|---|---|---|
| 4,927,780 | 5/1990 | Roth et al. | 437/72 |
| 5,008,207 | 4/1991 | Blouse et al. | 437/72 |
| 5,108,946 | 4/1992 | Zdebel et al. | 437/72 |
| 5,175,123 | 12/1992 | Vasquez et al. | 437/69 |
| 5,208,181 | 5/1993 | Chi | 437/70 |
| 5,234,861 | 8/1993 | Roisen et al. | 437/67 |
| 5,236,862 | 8/1993 | Pfiester et al. | 437/73 |
| 5,248,350 | 9/1993 | Lee | 437/69 |
| 5,260,229 | 11/1993 | Hodges et al. | 437/69 |

FOREIGN PATENT DOCUMENTS

| | | |
|---|---|---|
| 63-217640 | 9/1988 | Japan . |
| 2-49018 | 10/1990 | Japan . |
| 4-42822 | 7/1992 | Japan . |

OTHER PUBLICATIONS

Ghandhi, VLSI Fabrication Principles pp. 358–362, copyright 1983 John Wiley & Sons Inc.

Shimizu et al, IEEE, IEDM, pp. 279–282. copyright 1992 IEEE.

Teng, et al. IEEE Journal of Solid–State Circuits vol. SC–20 No. 1 Feb. 1985 pp. 44–51, copyright 1985 IEEE.

*Primary Examiner*—Olik Chaudhuri
*Assistant Examiner*—S. Mulpuri
*Attorney, Agent, or Firm*—Willian Brinks Hofer Gilson & Lione

[57] ABSTRACT

A first underlaid oxide layer, a polysilicon layer, and a first silicon nitride layer are formed on a silicon substrate in this order. Using a photoresist as a mask, a portion of the first silicon nitride layer, the polysilicon layer, the first underlaid oxide layer and the silicon substrate which is to be an isolation region is etched by a depth which regulates a length of bird's beak and a threshold voltage drop of a FET adequately. After forming a second underlaid oxide layer and a second silicon nitride layer, silicon nitride side walls of more than 25 nm in thickness are formed. An isolation oxide layer is formed by selective oxidation, using the silicon nitride layer as a mask. Favorable etched depth in the step of removing the silicon substrate is one third of the thickness of the isolation oxide layer. Favorable etched depth in case of a normal FET is 20–100 nm. Thus, bird's beak length is reduced, while adequately maintaining the threshold of the transistor at formation of the isolation of transistor. In a DRAM cell pattern, isolation of not exceeding 0.2 µm width can be formed.

10 Claims, 20 Drawing Sheets

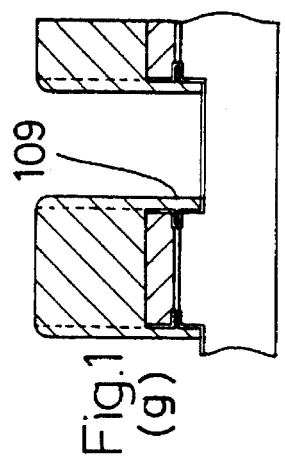
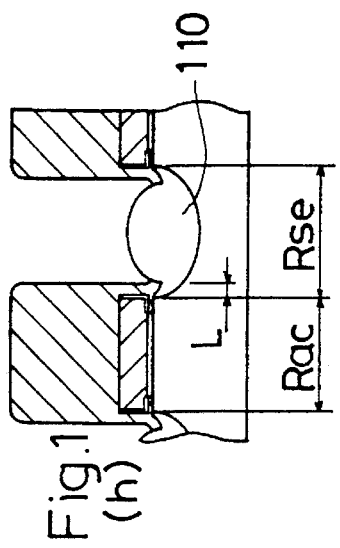
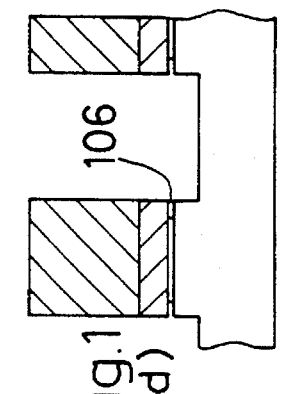
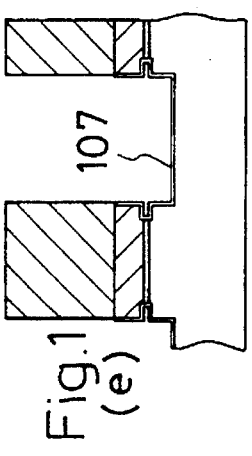
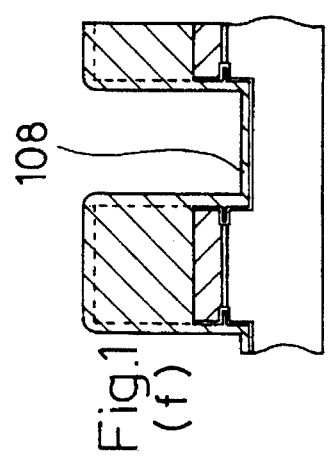
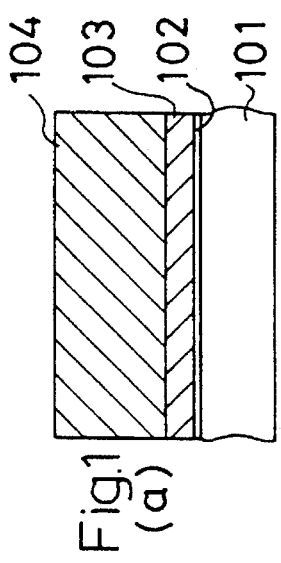
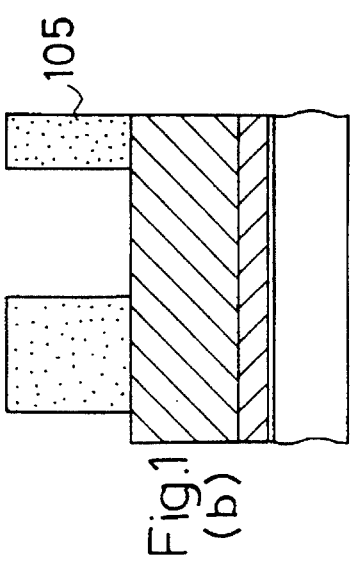
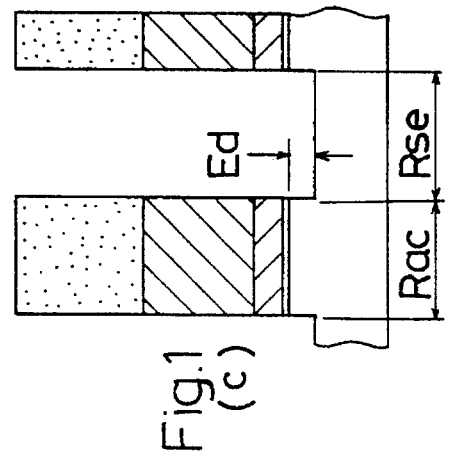

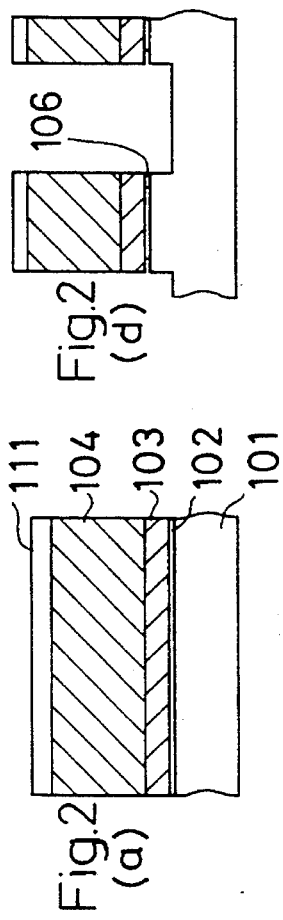
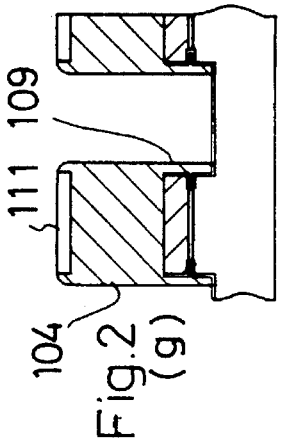
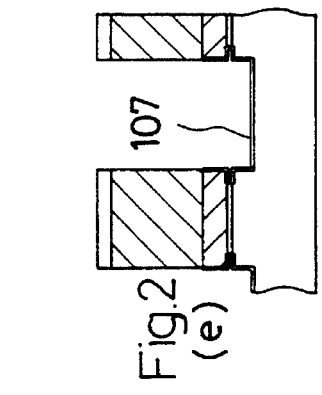
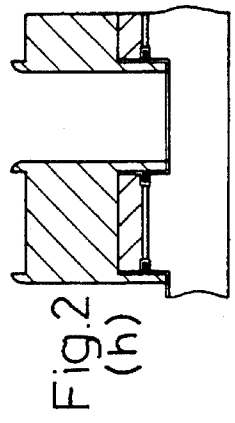
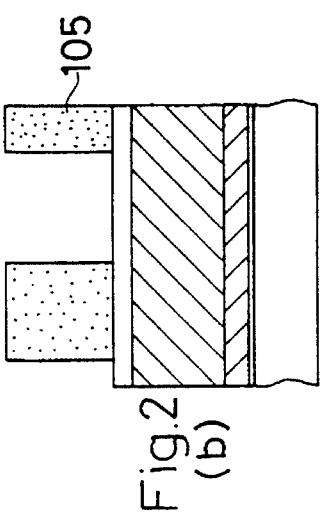
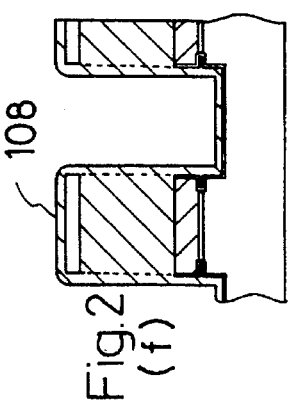
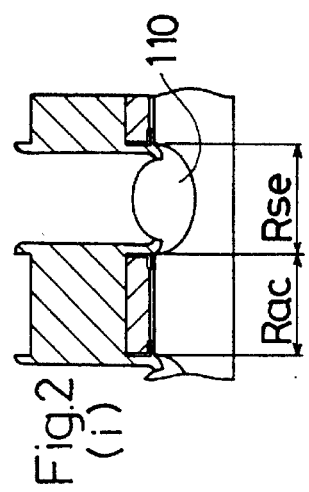
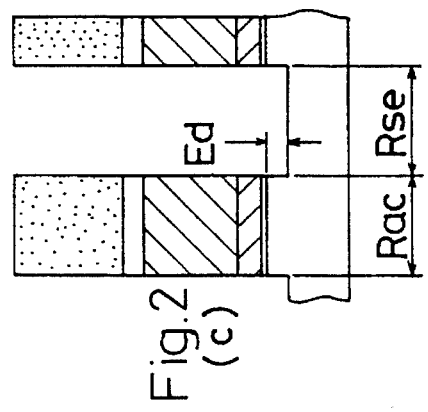

Fig.17(a) 30nm nitride side wall
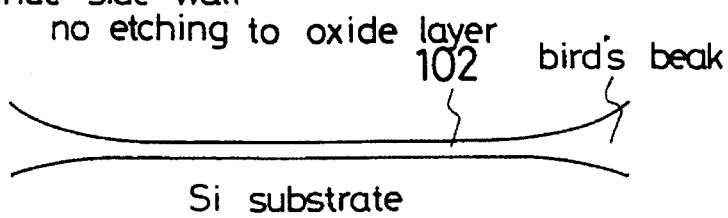
Fig.17(b) 15nm nitride side wall
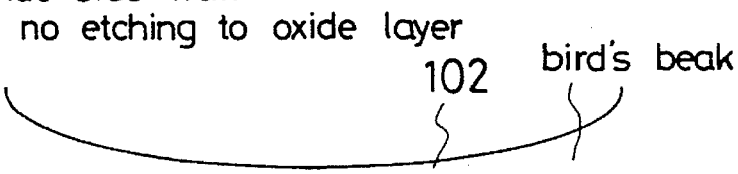

FIG. 18(a) 30nm NITRIDE SIDE WALL
20nm ETCHING TO OXIDE LAYER (10nm OVERETCHING)
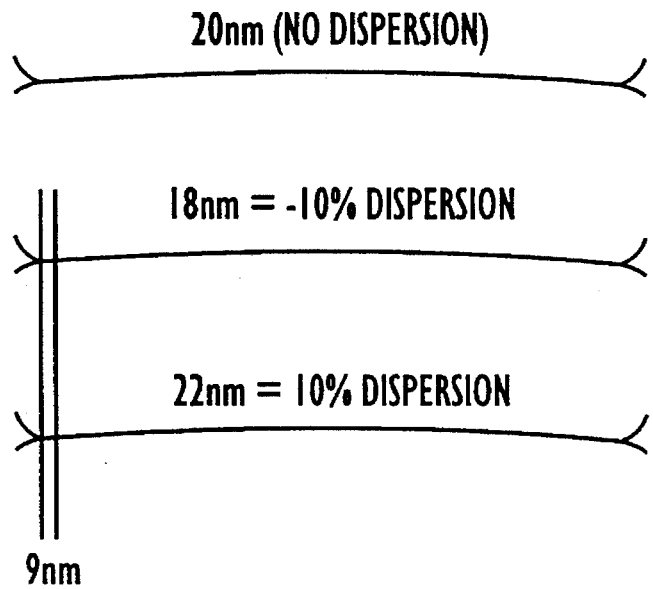
FIG. 18(b) 15nm NITRIDE SIDE WALL
30nm ETCHING TO OXIDE LAYER (20nm OVERETCHING)
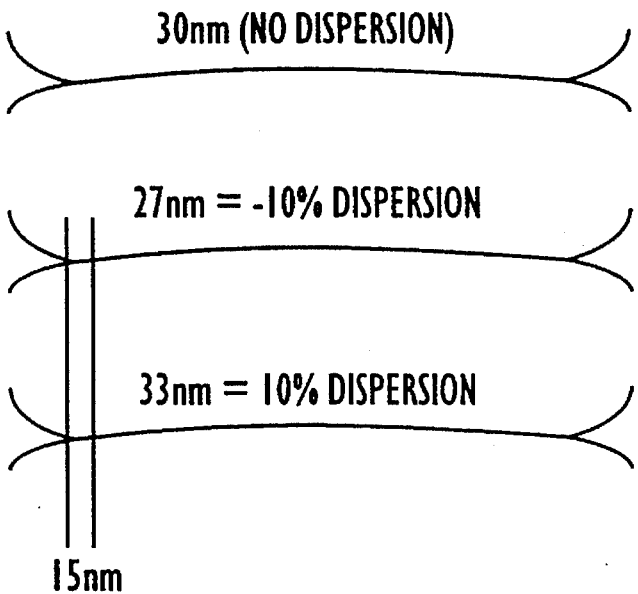

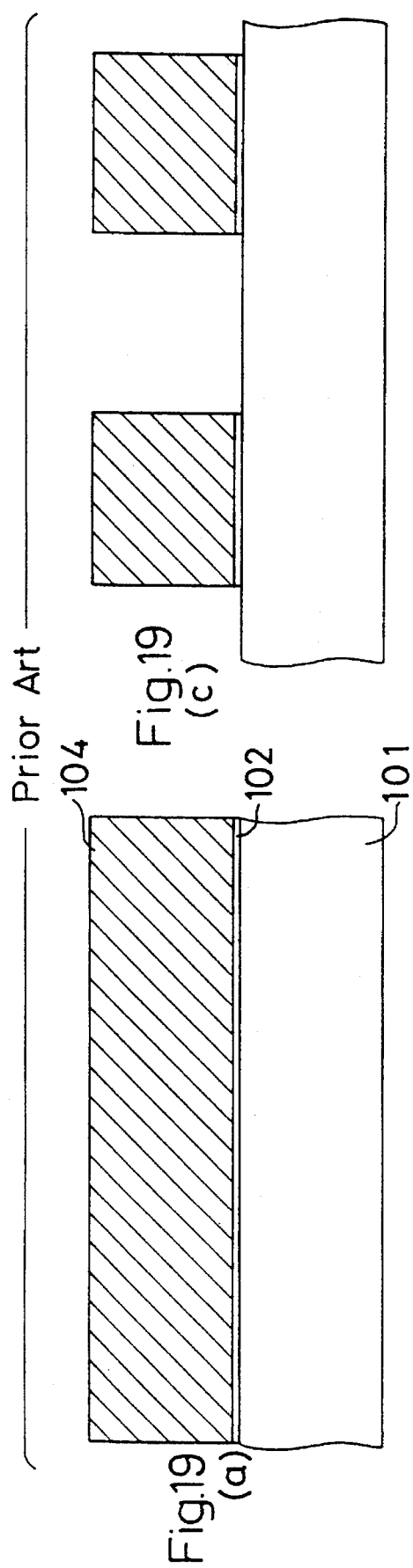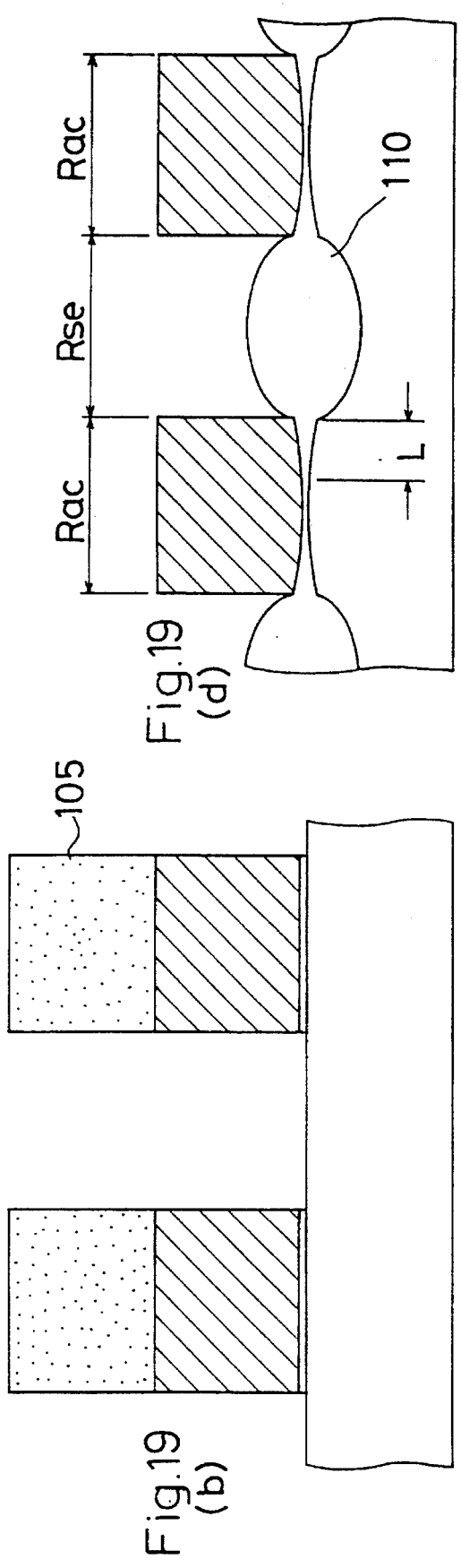
Fig.19 (Prior Art)

METHOD OF FORMING ISOLATION

This application is a Continuation-In-Part of application Ser. No. 087162,959, filed 8 Dec. 1998 now abandoned.

BACKGROUND OF THE INVENTION

This invention relates to a method of forming an isolation for isolating an active region at which a FET of a silicon substrate is to be formed from the other regions, and particularly relates to a countermeasure for reducing a transition region between an isolation region and the active region, i.e. bird's beak region.

Recently, accompanied by micro-fabrication of semiconductor elements, micro-fabrication of every region of the semiconductor elements has been required. Especially, in ease with formation of isolation according to a LOCOS method which is widely used because of stable characteristic with less manufacturing processes, a transition region between an isolation region and an active region, i.e. bird's beak region is not reduced contrary to the micro-fabrication of the semiconductor elements. As a result, the bird's beak region occupies large area in contrast to the semiconductor elements, which bars micro-fabrication of the semiconductor elements. Various methods of reducing birds' beak by improving the LOCOS methods are proposed.

A conventional LOCOS method and improved LOCOS methods are explained, with reference to accompanying drawings.

FIGS. 19(a)–(d) are sections each showing a manufacturing process in case where an isolation is formed according to the conventional LOCOS method. An underlaid oxide layer 102 and a silicon nitride layer 104 are deposited in this order on a silicon substrate 101 (in FIG. 19(a)), a mask of photoresist 105 is formed so as to have a pattern whose aperture corresponds to an isolation region to be formed, and the silicon nitride layer 104 and the underlaid oxide layer 102 at the aperture are removed by etch (FIG. 19(b)). After the photoresist 105 is removed (FIG. 19(c)), a selectively oxidized oxide layer 110 for isolation is formed on the silicon substrate 101 by oxidation using the silicon nitride layer 104 as a mask to define the surface of the substrate into an active region Rac and an isolation region Rse (FIG. 19(d)). During the step of oxidizing for forming the isolation region Rse, a transition region called bird's beak that the oxide layer encroaches by a certain length L from the isolation region Rse to the active region Rac as shown in FIG. 19(d) is produce because of oxidation of the silicon substrate 101 by lateral diffusion of oxidizing agent, oxide, through the underlaid layer oxide 102.

An example of improved LOCOS methods is disclosed in IEEE Electron Device Letters EDL-11, P.549 (1990). FIGS. 20(a)–(g) are sections each showing a manufacturing process according to one of improved LOCOS methods called RLS-PBL method. A first underlaid oxide layer 102, a polysilicon layer 103 and a first silicon nitride layer 104 are deposited in this order on a silicon substrate 101 (FIG. 20(a)), a mask of photoresist 105 having a pattern whose aperture corresponds to an isolation region to be formed is formed and the first underlaid oxide layer 102, the polysilicon layer 103 and the first silicon nitride layer 104 are removed by etch (FIG. 20(b)). Then the photoresist 105 is removed and the first underlaid oxide layer 102 is wet-etched, recessing the first underlaid oxide layer 102 from the pattern, to form an undercut 106 (FIG. 20(c)). Next, the silicon substrate 101 is oxidized to form a second underlaid oxide layer 107 (FIG. 20(d)), a second silicon nitride layer 108 is deposited entirely over the surface of the substrate (FIG. 20(e)), and the silicon nitride layer 108 is anisotropically etched to form a silicon nitride side walls 109 (FIG. 20(f)). Finally, an isolation oxide layer 110 for isolating between the active regions Rac is formed by oxidizing the silicon substrate 101, thus defining the surface of the substrate into the active region Rac and the isolation region Rse (FIG. 20(g)).

With the above structure, laterally encroaching length L of the bird's beak is reduced because the polysilicon layer 103 absorbs oxide diffused through the second underlaid oxide layer 107 and the first underlaid oxide layer 102. Further, the polysilicon layer 103 serves as a layer for buffering stress from the first silicon nitride layer 104 to the silicon substrate 101 during oxidation for forming the isolation region Rse.

As disclosed in Laid Open unexamined Japanese Patent Application No. 63-217640, well known is a technique that flatness of the surface of the substrate and the encroaching length of the bird's beak are fallen in respectively appropriate ranges by removing a portion of the silicon substrate at which the isolation is to be formed by the depth of 0.40–0.6 times of the thickness of the isolation oxide layer, considering that the thick isolation according to the LOCOS method degrades the flatness and increases the encroaching length of the bird's beak.

In general, in such the LOCOS method, there are two method for preventing the bird's beak; by restriction of oxide supply; and by restriction of volume variation due to bird's beak. Well known is that the thinner the underlaid oxide layer 102 is or the thicker the silicon nitride layer 104 is, the shorter the encroaching length L of the bird's beak is. Because, even though the oxide enters into the underlaid oxide layer 102 to oxidize and expand the silicon substrate thereunder, the entering of the oxide is prevented by restricting the expansion by the silicon nitride layer 104.

However, the thin underlaid oxide layer 102 and the thick silicon nitride layer 104 increase stress in the silicon substrate 101 during the oxidation, which causes crystal defect in the silicon substrate 101. Upon the crystal defect in the silicon substrate 101, increase of junction leakage current and degradation of durability to high voltage of gate oxide layer of a MOS transistor are caused, and in its turn the device characteristic is degraded. In other words, thicknesses of the underlaid oxide layer 102 and of the silicon nitride layer 104 are respectively too restricted to reduce the encroaching length L of the bird's beak to the active region Rac.

On the other hand, the RLS-PBL method which is one of the improved LOCOS methods, the second underlaid oxide layer 107 is so thin that the oxide supply to the active region Rac during the oxidation is little and the supplied oxide is absorbed by the polysilicon layer 103 which serves as a buffer. Consequently, the encroaching length L of the bird's beak to the active region Rac is reduced, compared with that according to the LOCOS method.

However, upon micro-pattern fabrication accompanied by high integration of semiconductor device, bird's beak is caused by the oxide supplied to the active region Rac from lower edges of the silicon nitride side walls 109 adjacent to the isolation region Rse. Further, according to the RLS-PBL method, since length that the isolation oxide layer 110 enters in a depth direction of the substrate is so short that the punch-though voltage between neighbor junctions is lowered associated by the micro-fabrication of the pattern.

The method according to the Laid Open unexamined

Japanese Patent Application No. 63-217640, by removing the region at which the isolation is to be formed by 0.4–0.6 -times of the thickness of the isolation oxide layer, the encroaching length of the bird's beak is reduced. However, such a large step height causes a drop of a threshold voltage of a FET to be formed at a region surrounded by the isolation. In detail, in case with a large step height at an interface between the isolation region and the active region, when a voltage is applied to the step part via a gate electrode, an electric field from upper surface and side surface is applied to the step part, so that a channel is formed which produces a double threshold type transistor. When an impurity density of the channel stop is made high in order to prevent the generation of the double threshold transistor, the impurity is diffused in a vicinity of both edges of the channel region of the active region, so that a narrow-channel effect is caused in a transistor in micro-dimension, such as a memory cell. Consequently, the technique in the reference can reduce the encroaching length of the bird's beak but hardly maintain the characteristics of threshold in the micro transistor.

The object of the present invention is to reduce the encroaching length of bird's beak and to micro-fabricate a pattern with excellent characteristics of a semiconductor device by improving the RLS-PBL method and by providing means for enlarging the distance between the edges of the nitride layer side walls to the surface of the active region. The improvement cause no deterioration of the device characteristics which is accompanied by micro-fabrication of the pattern and no degradation of electric property due to crystal defect in the substrate by stress during the oxidation for isolation formation.

SUMMARY OF THE INVENTION

To attain the above object, in the present invention, a method of forming an isolation for isolating an active region at which a FET is to be formed from other regions on a surface of a silicon substrate, comprising the steps of:

forming a first underlaid oxide layer by oxidizing the silicon substrate;

forming a silicon layer on the first underlaid oxide layer;

forming a first silicon nitride layer on the silicon layer;

removing a portion of the silicon substrate at which an isolation is to be formed to a depth which regulates an encroaching length of bird's beak of the isolation to the active region and a drop of a threshold voltage of the FET to be formed by etching the first silicon nitride layer, the silicon layer, the first underlaid oxide layer and the silicon substrate, using a mask of a pattern whose aperture corresponds to the isolation region;

oxidizing the silicon substrate and the silicon layer to form a second underlaid oxide layer on surfaces thereof;

forming a second silicon nitride layer entirely over the substrate on which the second underlaid oxide layer is formed;

anisotropically etching the second silicon nitride layer so as to remove at least the second silicon nitride layer in a region at which the isolation region is to be formed and so as to leave silicon nitride side walls of more than 25 nm in thickness which are made of the second silicon nitride layer at a side part of the first silicon nitride layer, at a side part of the silicon layer, and at a side part of a step part of the silicon substrate;

forming the oxide layer to be the isolation by selectively oxidizing the silicon substrate, using as a mask the first silicon nitride layer and the second silicon nitride layer, removing the first and second silicon nitride layers and the silicon layer after the formation of the oxide layer to be the isolation; and removing the first underlaid oxide layer by etching.

According to the method, the distance between the active region and lower edges of the silicon nitride side walls, i.e. edges of the isolation region is elongated, and the silicon layer on the first underlaid oxide layer absorbs the oxide diffused through the second underlaid oxide layer, so that the encroaching length of the bird's beak to the surface of the active region is restricted. Also, the silicon layer buffers the stress owing to bias force of the first silicon nitride layer and prevents the generation of crystal defect in the silicon substrate which electrically influences to the semiconductor elements. Since the depth of the isolation region to be removed is so set that the bird's beak encroaching length and the threshold of the FET are within respectively appropriate ranges, the deterioration of the FET characteristic due to the micro-fabrication and the presence of the step at the isolation region is prevented. Since the isolation oxide layer is field-oxidized with the silicon nitride side wall of more than 25 nm in thickness formed, the bird's beak from the field oxide layer to the first underlaid oxide layer is restricted. Therefore, the bird's beak of the first underlaid oxide layer less remains with less overetching amount at the step of etching the first underlaid oxide layer. As a result, the dispersion in width of active region for forming a micro transistor is restricted, so that allowances of dispersion in photo-lithography and dry etching are enlarged.

The above method of forming an isolation of a FET is applicable to a case with a thickness-keeping oxide layer on the first silicon nitride layer. In this case, prevented is the lowering of the restricting effect against oxide diffusion of the first silicon nitride layer caused by thinning of the first silicon nitride layer due to over-etch at the formation of the silicon nitride side walls.

Followings are preferable in the above two methods.

In the step of removing the portion at which the isolation of the silicon substrate is to be formed, the upper limit of the depth at the part to be removed is so set that the drop of the threshold of the FET is not exceeding 0.15 V. Accordingly, the drop of the threshold is less than about 20% of the threshold voltage in a general transistor (about 0.7 V). Therefore, prevented is the degradation of various characteristics such as a synchronous function of a memory or a processor with a clock frequency.

In the step of removing the portion of the silicon substrate at which the isolation is to be formed, the lower limit of the depth at the part to be removed is so set that the encroaching length of the bird's beak of the oxide layer for isolation is not exceeding 0.2 μm, taking account of the thickness of the oxide layer for isolation. Accordingly, the narrow-channel effect is prevented and a sufficient space for source and drain regions is ensured even with a micro FET.

In the step of removing the portion of the silicon substrate at which the isolation is to be formed, the depth at the part to be removed is set in a range between 20 nm and 100 nm. Accordingly, the encroaching length of bird's beak is restricted to not exceeding 0.2 μm in case of a micro transistor, which enables to manufacture a high density FET, e.g. a DRAM having excellent characteristic and to easily prevent drop of the voltage at punch-through occurrence, in relation to below-described impurity ion implant.

In the step of removing the portion of the silicon substrate at which the isolation is to be formed, an upper limit of the depth at the part to be removed is one third of a thickness of the isolation to be formed. Accordingly, the junction leakage current density is restricted to low, the pause time characteristic which is important for a DRAM memory cell is ensured, and the drop of the threshold voltage, or generation of a double threshold transistor that a transistor is in ON state even at lower gate voltage is prevented. In addition, the threshold variation amount is made less.

The step of removing the first underlaid oxide layer by etching is performed so as to form an undercut according to isotropical etching. Accordingly, the encroaching length of Bird's beak is further reduced.

An impurity ion for forming a punch-through stopper is implanted entirely into the active region and the isolation region after the formation of the isolation. Thus, the threshold increase, i.e. narrow-channel effect is restricted.

BRIEF DESCRIPTION OF THE ACCOMPANYING DRAWINGS

FIGS. 1(a)–(h) are sections of a silicon substrate in respective isolation forming steps in a first embodiment.

FIGS. 2(a)–(i) are sections of a silicon substrate in respective isolation forming steps in a second embodiment.

Figure 11A:
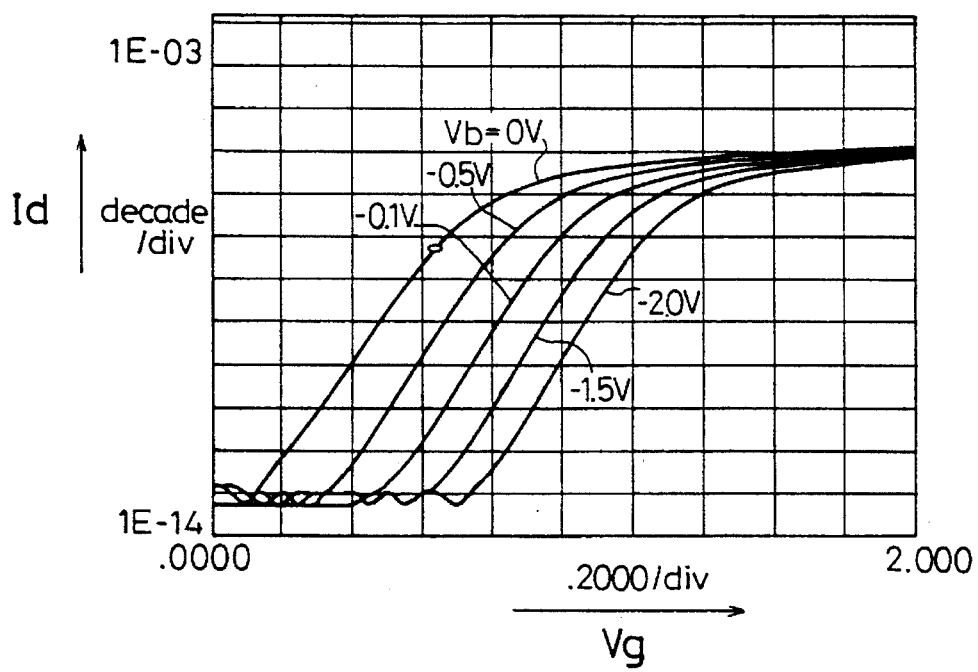
Figure 11B:
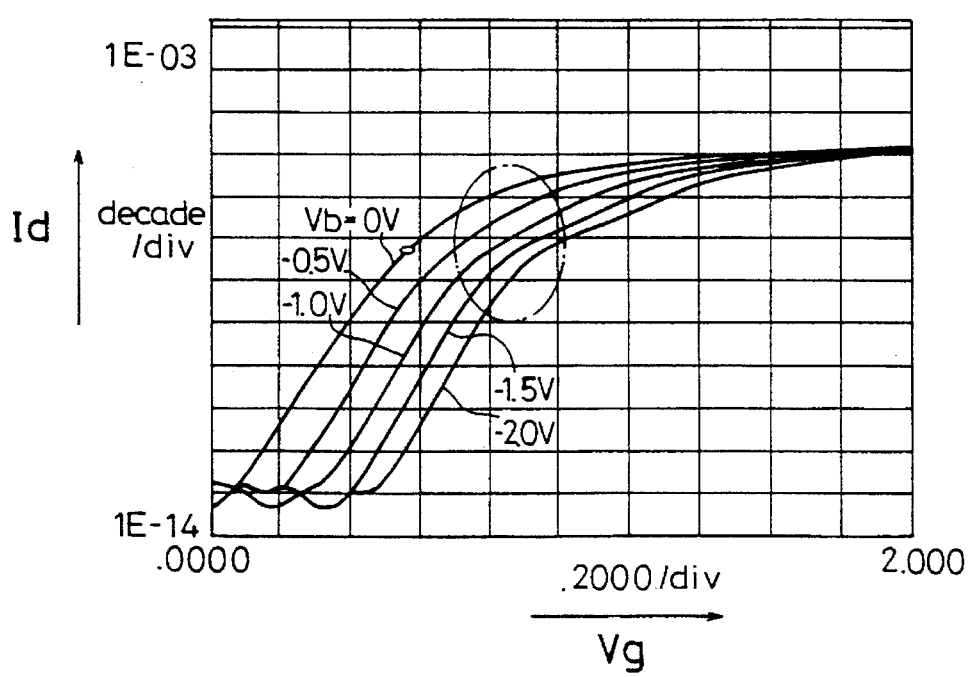

FIGS. 11(a)–(b) are graphs showing experimental data regarding influence that the sub-threshold characteristic receives according to etched depth.

Figure 12:
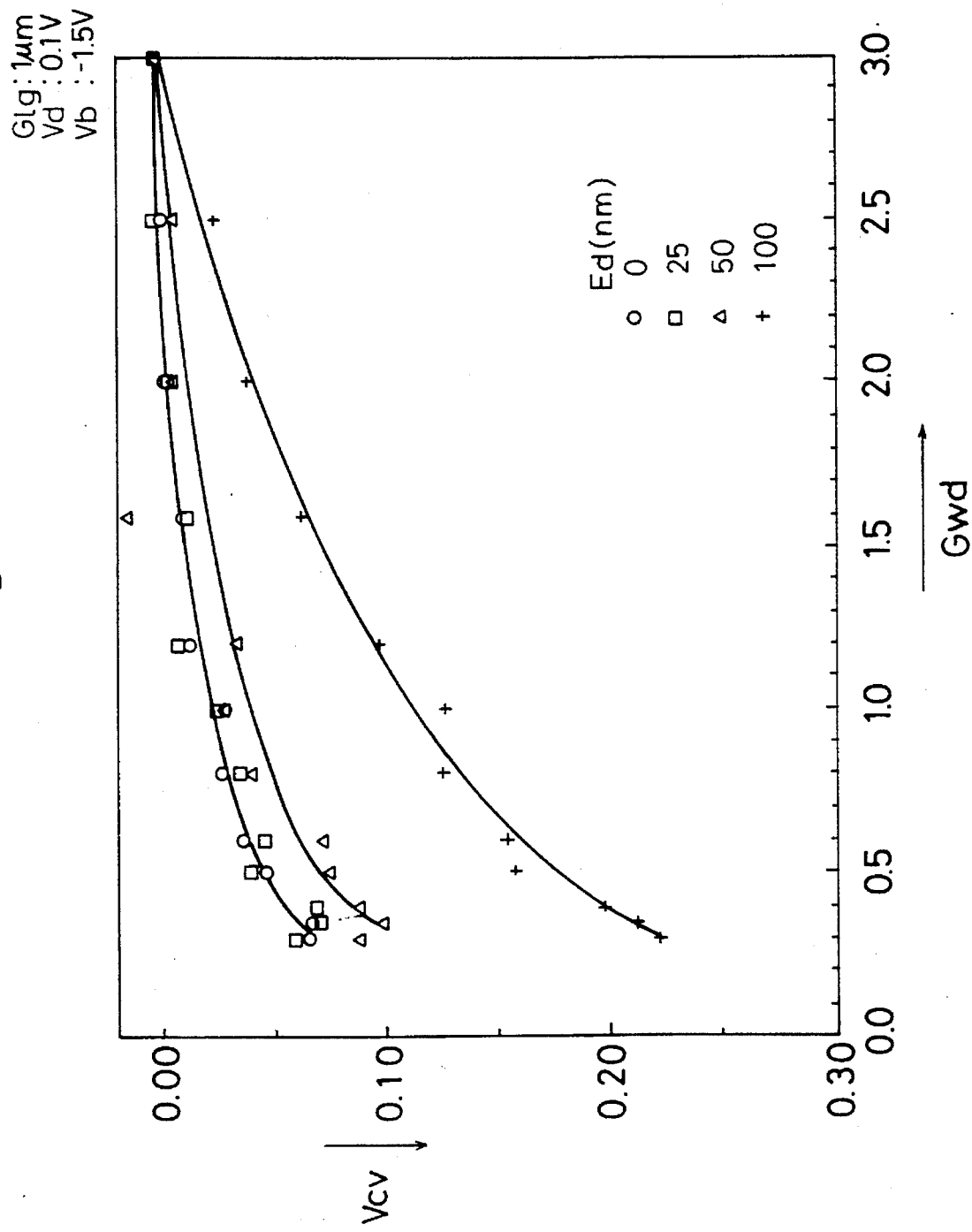

FIG. 12 is a graph showing experimental data of threshold variation amount with respect to width of a transistor.

Figure 13:
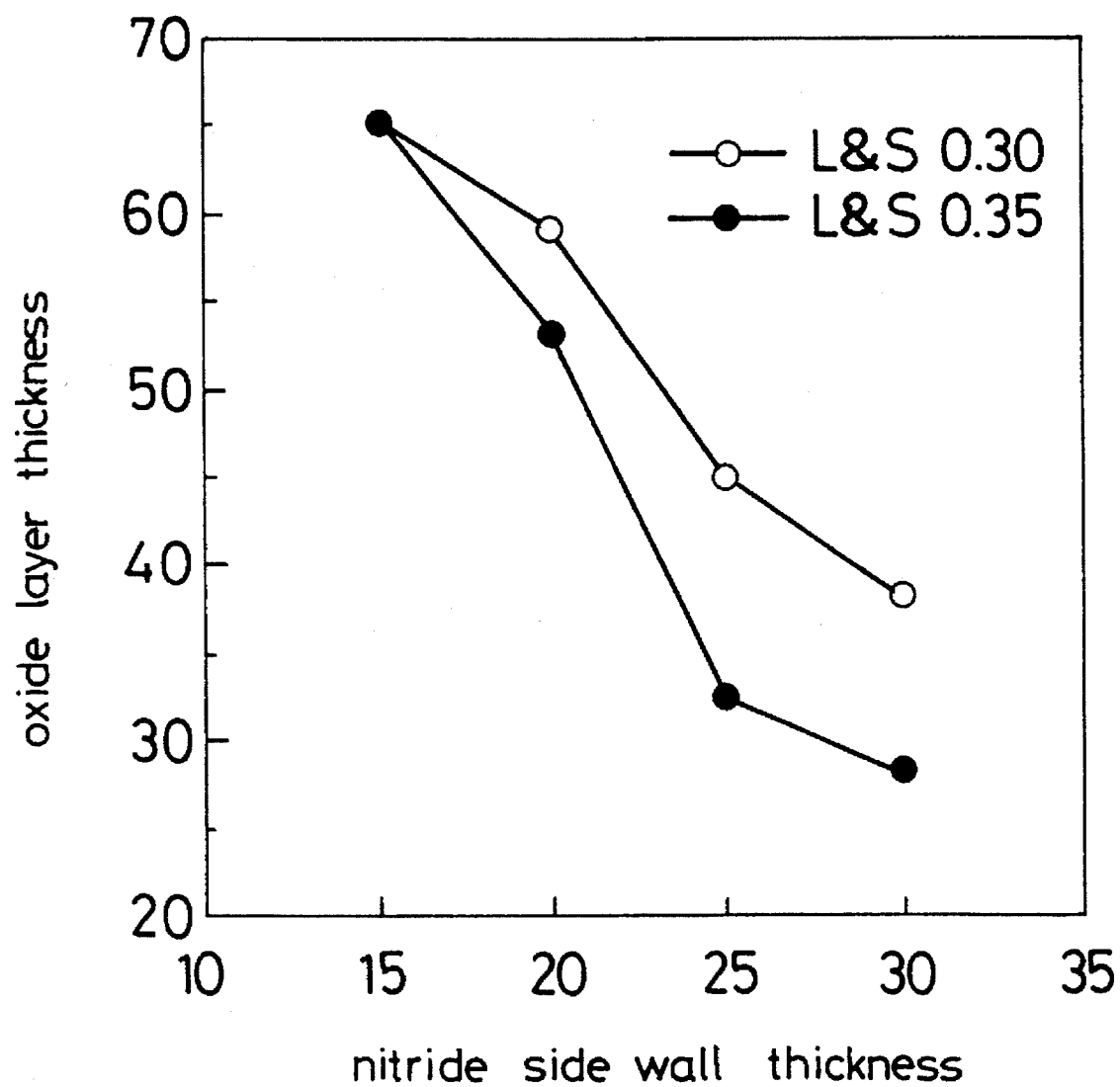

FIG. 13 is a graph showing a variation in thickness of a first underlaid oxide layer with respect to the thickness of the nitride side wall.

Figure 14:
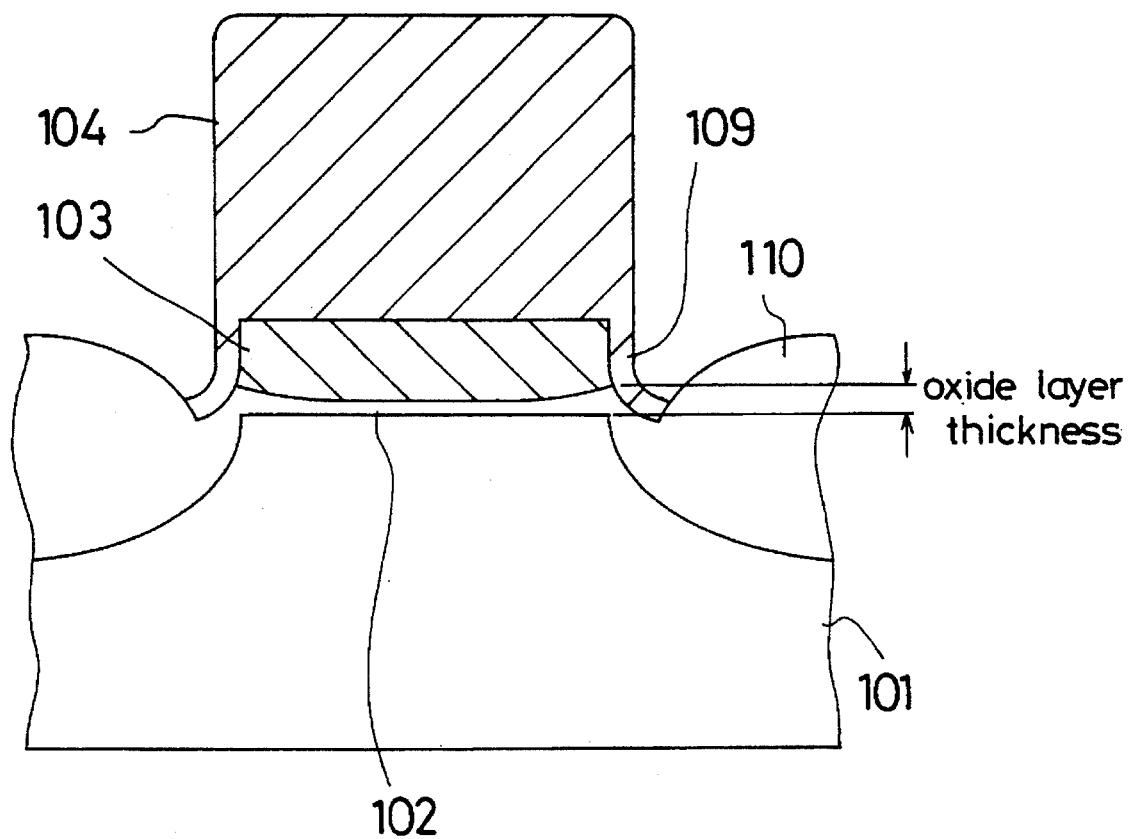

FIG. 14 is a section showing the first underlaid oxide layer at the formation of an isolation oxide layer.

Figure 15:
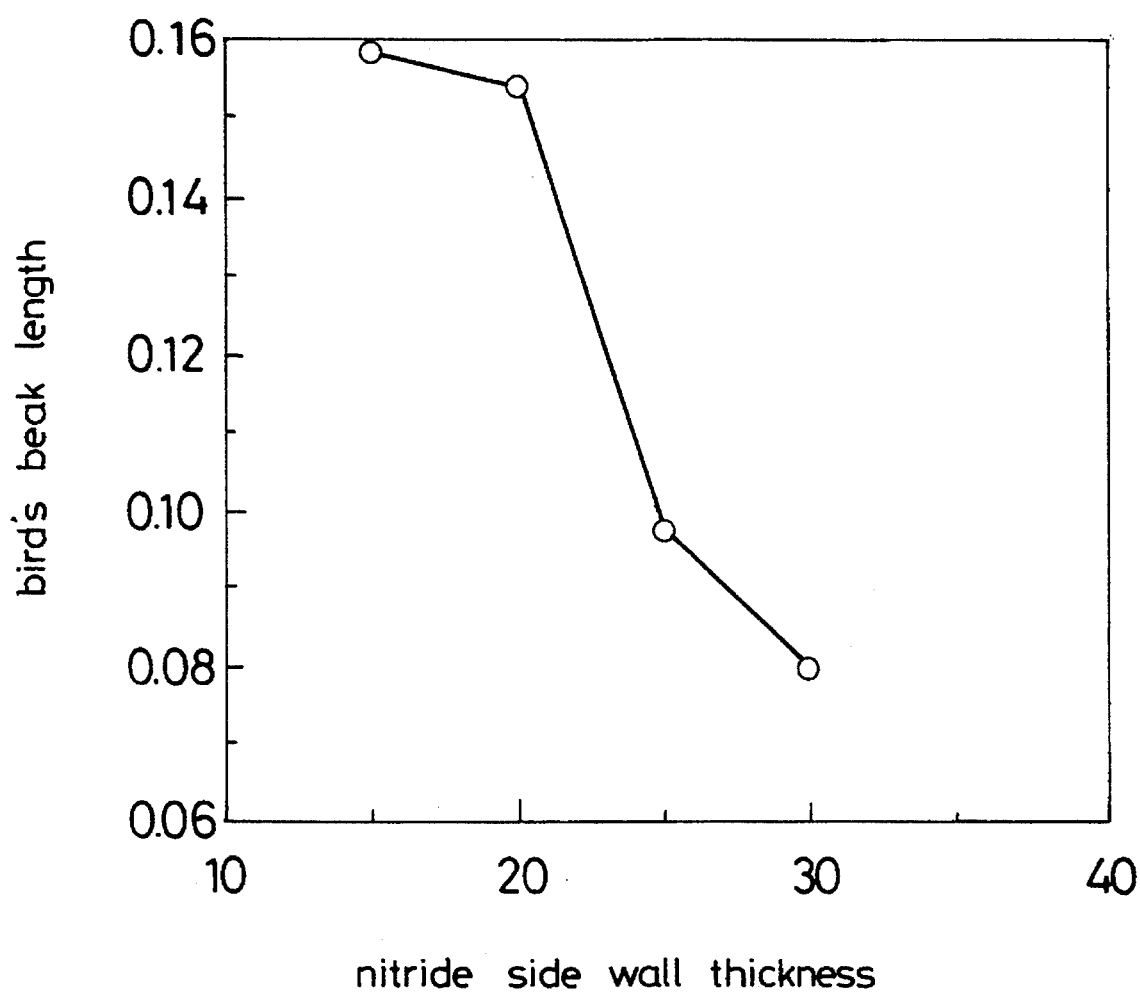

FIG. 15 is a graph showing a variation in length of bird's beak with respect to the thickness of the nitride side wall.

Figure 16A:
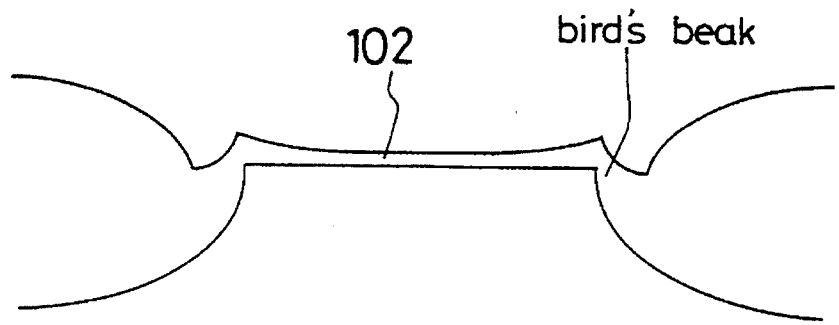
Figure 16B:
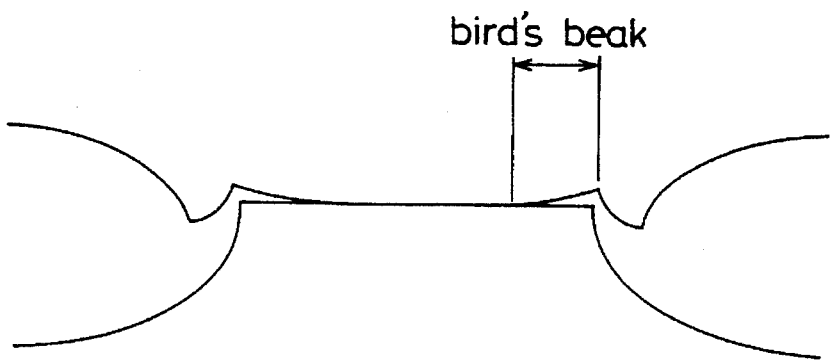
Figure 16C:
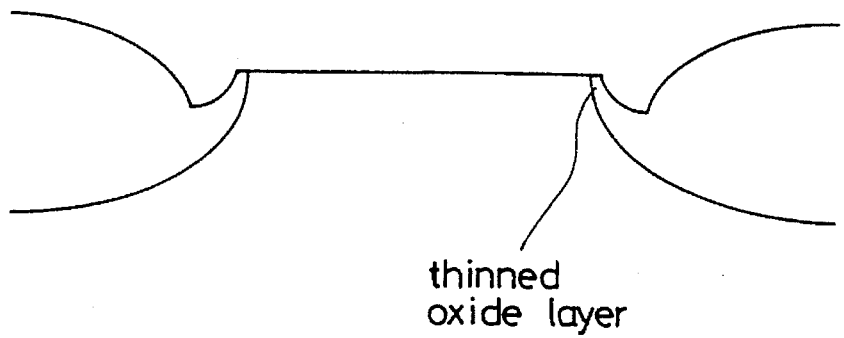
Figure 20:
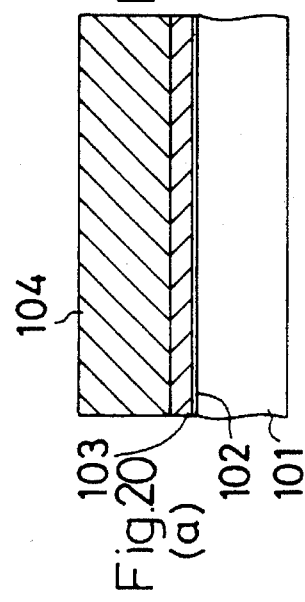
Figure 20:
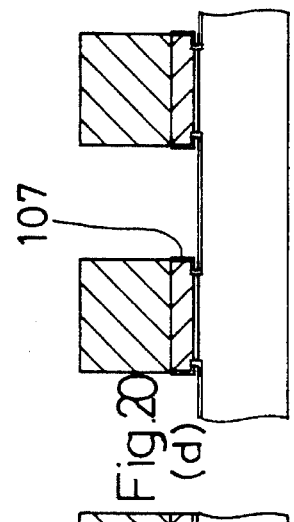
Figure 20:
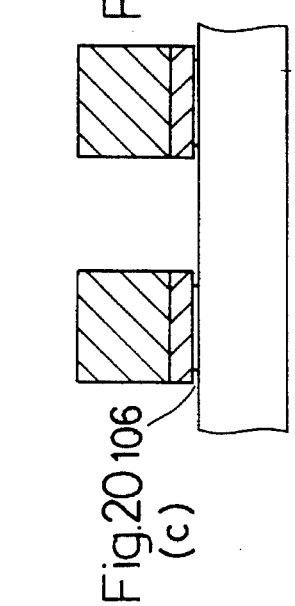
Figure 20:
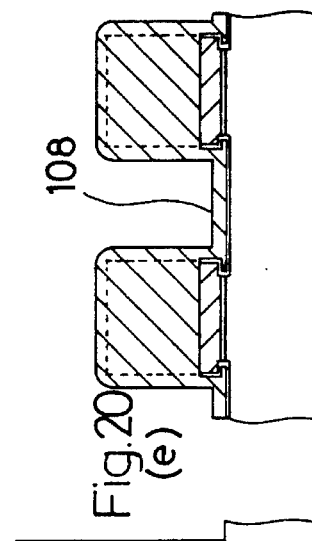
Figure 20:
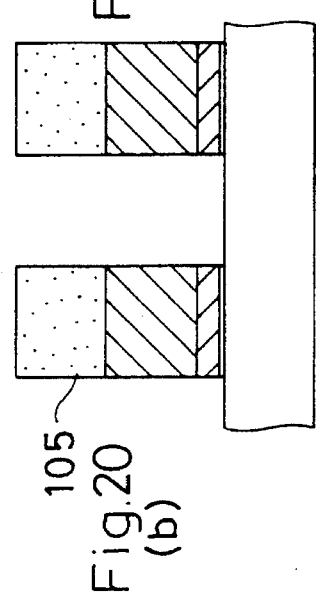
Figure 20:
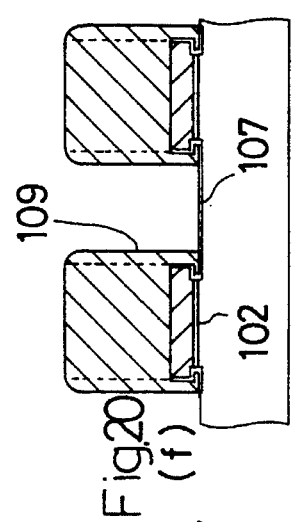
Figure 20:
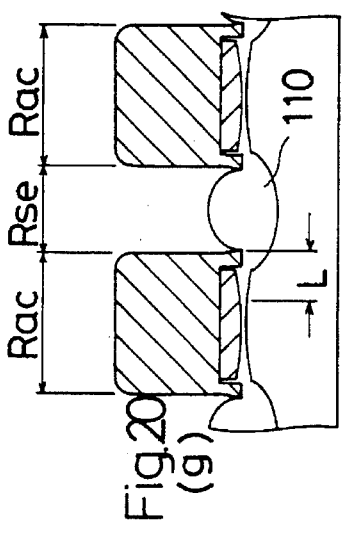

FIGS. 16(a), 16(b) and 16(c) are explanatory drawings each showing a sectional shape of the first underlaid oxide layer before etching and after overetching.

FIGS. 17(a) and 17(b) are explanatory drawings each showing a variation in shape of remaining bird's beak with respect to the etched amount of the oxide layer.

FIGS. 18(a) and 18(b) are explanatory drawings each showing dispersion in width of active region in a case where the dispersion of etched amount of the oxide layer is ±10%

FIGS. 19(a)–(d) are sections of a silicon substrate in respective isolation forming steps according to a conventional LOCOS method.

FIGS. 20(a)–(g) are sections of a silicon substrate in respective isolation forming steps according to a conventional RLS-PBL method.

DETAILED DESCRIPTION OF PREFERRED EMBODIMENTS

A method of forming an isolation according to embodiments of the present invention is described below, with reference to accompanying drawings.
(FIRST EMBODIMENT)

FIGS. 1(a)–(h) are sections each showing a state at each step for forming an isolation in the first embodiment.

First, a 10 nm first underlaid oxide layer 102 is formed by oxidizing a silicon substrate 101 at 900° C. under a dry oxidizing atmosphere, a 50 nm polysilicon layer 103 for buffering stress and for absorbing oxide is deposited according to a low pressure CVD method, and a 200 nm first silicon nitride layer 104 to be a mask is deposited according to the low pressure CVD method (FIG. 1(a)). Then, a photoresist 105 having a pattern whose aperture corresponds to a part at which an isolation region Rse is formed is formed on the silicon substrate 101 (FIG. 1(b)), the first silicon nitride layer 104, the polysilicon layer 103, the first underlaid oxide layer 102 and the silicon substrate 101 are anisotropically dry-etched (RIE), using the photoresist 105 as a mask, to remove, by a depth Ed (about 50 nm in the present invention), a part of the silicon substrate 101 which corresponds to the isolation region Rse to be formed (FIG. 1(c)).

Thereafter, the photoresist 105 is removed and the first underlaid oxide layer 102 is recessed 30 nm from a side of the pattern to form an undercut 106 by wet etch (FIG. 1(d)). Then, the silicon substrate 101 is oxidized 6 nm at 900° C. under the dry oxidizing atmosphere to form a second underlaid oxide layer 107 (FIG. 1(e)), and a 25 nm silicon nitride layer is deposited over the silicon substrate 101 entirely according to the low pressure CVD method to form a second silicon nitride layer 108 (FIG. 1(f)).

Next, the second silicon nitride layer 108 on the isolation region Rse and on the first silicon nitride layer 104 is removed by anisotropically dry-etching the second silicon nitride layer 108, nitride side walls 109 are formed, leaving the second silicon nitride layer 108, at sides of the first silicon nitride layer 104 and at sides of the second underlaid oxide layer 107 on the isolation region Rse (FIG. 1(g)), and the silicon substrate 101 is oxidized 350 nm at 1000° C. under wet atmosphere to form an isolation oxide layer 110. Thus, the isolation region Rse for isolating each active regions Rac is formed (FIG. 1(h)).

In the first embodiment, the oxide as an oxidizing agent is diffused through the second underlaid oxide layer 107 during the oxidation for forming the isolation oxide layer 110. However, a distance between each lower edge of the nitride side walls 109 and a surface of the active region Rac becomes long since the silicon substrate 101 is etched by a predetermined depth at a part of the isolation oxide layer 110, and the polysilicon layer 103 formed on the active region Rac absorbs the oxide. Consequently, the encroaching length of bird's beak is reduced. Further, the polysilicon layer 103 serves as a buffer of stress in the silicon substrate 101, which prevents the generation of crystal defect that involves electrically bad influence to semiconductor elements.

(SECOND EMBODIMENT)

FIGS. 2(a)–(i) are sections each showing a state at each step for forming an isolation in the second embodiment.

First, after the first underlaid oxide layer 102, the polysilicon layer 103 and the first silicon nitride layer 104 are formed in the same manner and under the same conditions as in the first embodiment, a thickness-keeping oxide layer 111 which is to be a etch stopper is deposited on the first silicon nitride layer 104 according to the low pressure CVD method (FIG. 2(a)).

Then, the mask of photoresist 105 is formed in the same manner and under the same conditions as in the first embodiment (FIG. 2(b)), and the thickness-keeping oxide layer 111, the first silicon nitride layer 104, the polysilicon layer 103, the first underlaid oxide layer 102 and the silicon substrate 101 are anisotropically dry-etched to remove, by the depth Ed of 50 nm, a portion of the silicon substrate 101 which is to be the isolation region Rse (FIG. 2(c)).

Further, the undercut 106 around the first underlaid oxide layer 102 is formed (FIG. 2(d)) in the same manner and under the same condition as shown in FIGS. 1(d)–(f) in the first embodiment, the second underlaid oxide layer 107 is formed (FIG. 2(e)), and the second silicon nitride layer 108 is formed (FIG. 2(f)).

Then, the nitride side walls 109 are formed, leaving the second silicon nitride layer 108, in the same manner and under the same condition shown in FIG. 1 (g) in the first embodiment. At this time, the first silicon nitride layer 104 is protected by the thickness-keeping oxide layer 111 even with over-etch at formation of the nitride side walls 109. Therefore, the thickness of the first silicon nitride layer 104 is not changed, keeping the initial thickness. After the thickness-keeping oxide layer 111 is removed by wet-etch (FIG. 1(h)), the silicon substrate 101 is oxidized 350 nm at 1000° C. under the wet atmosphere to form the isolation oxide layer 110, and the isolation region Rse for isolating between each active region Rac is formed (FIG. 2(i)).

In the second embodiment, as well as in the first embodiment, the encroaching length L of bird's beak is reduced by providing the nitride side walls 109 and the polysilicon layer 103 and the thickness of the first silicon nitride layer 103 is prevented from reducing by the thickness-keeping oxide layer 111. When the thickness of the first silicon nitride layer 104 is decreased owing to over-etch, restriction of oxide diffusion by bias force (weight) of the thick first silicon nitride layer 104 is decreased. However, the thickness-keeping oxide layer 111 prevents the lowering of restriction against oxide diffusion.

Differences in characteristic of the semiconductor element due to difference in isolation forming method are discussed in detail, referring to each embodiment and data of experiments conducted according to each embodiment.

Figure 3:
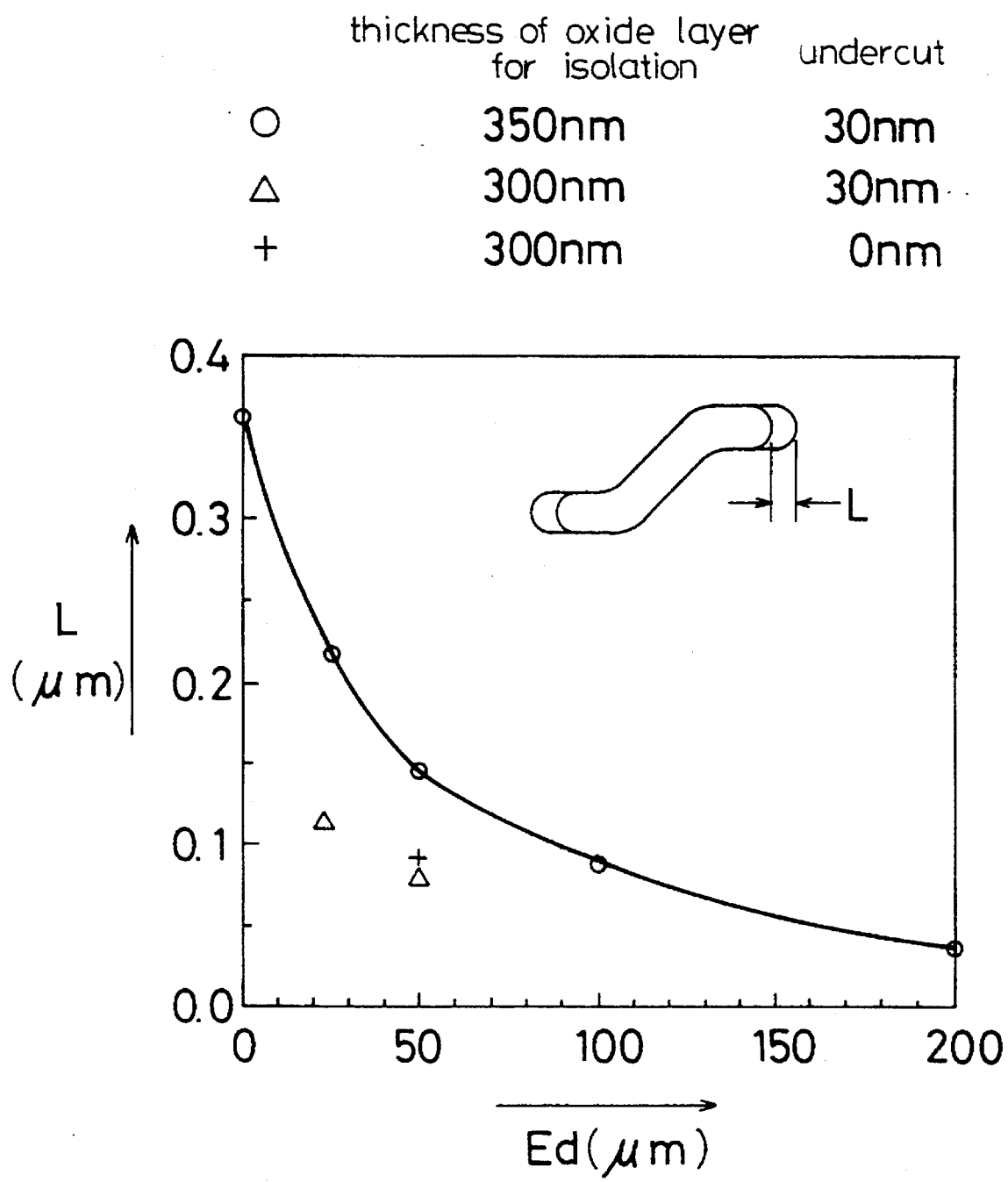
FIG. 3 is a graph showing dependencies of bird's beak encroaching length with respect to etched amount of a silicon substrate in case the present invention is applied to a DRAM memory cell.

FIG. 3 shows a relation between the etched depth Ed of the silicon substrate 101 at the isolation region Rse of a DRAM memory cell and encroaching length L of bird's beak, wherein the isolation oxide layer 110 is varied in thickness. Each mark ○ denotes a value in case with 350 nm isolation oxide layer 110 and the undercut at the first underlaid oxide layer 102, each mark Δ denotes a value in case with 300 nm isolation oxide layer 110 and the undercut thereat, and each mark + denotes a value in case with 300 nm isolation oxide layer 100 and without undercut. As can be seen from the figure, in the conventional RLS-PBL method, the distance between the edges of the nitride side walls 109 and the surface of the active region Rac is so short (corresponding to a point at etched depth Ed is 0 in FIG. 3) that the oxide as the oxidizing agent is easily diffused through the second underlaid oxide layer 107 during the oxidation of the silicon substrate 101 and the encroaching length L of bird's beak becomes long (0.36 μm in FIG. 3 ), which gives severe influence particularly to a pattern edge part. On the other hand, in each embodiment, since the silicon substrate 101 is etched at its part of the isolation oxide layer 110, the distance between the edges of the nitride side walls 109 and the surface of the active region Rac is long by the step height, which prevents the diffusion of the oxide into the active region Rac. Thus, the elongation of the encroaching length L of bird's beak is restricted (about 0.14 μm in case of 50 nm etched depth Ed as in each embodiment).

Also, as indicated in FIG. 3, by providing the undercut at the first underlaid oxide layer 102, the encroaching length L of bird's beak is further reduced. Wherein, the step of providing the undercut may be omitted.

In case where a memory cell of 0.72 μm$^2$ area is formed, the encroaching length L of bird's beak is required to be not exceeding 0.2 μm. Accordingly, as cleared from FIG. 3, the etched depth Ed of the silicon substrate 101 at the isolation region Rse is preferably set to be equal to or more than 30 nm in case with 350 nm thick isolation oxide layer. In case with 300 nm thick isolation oxide layer, 25 nm etched depth Ed suffice.

Figure 4:
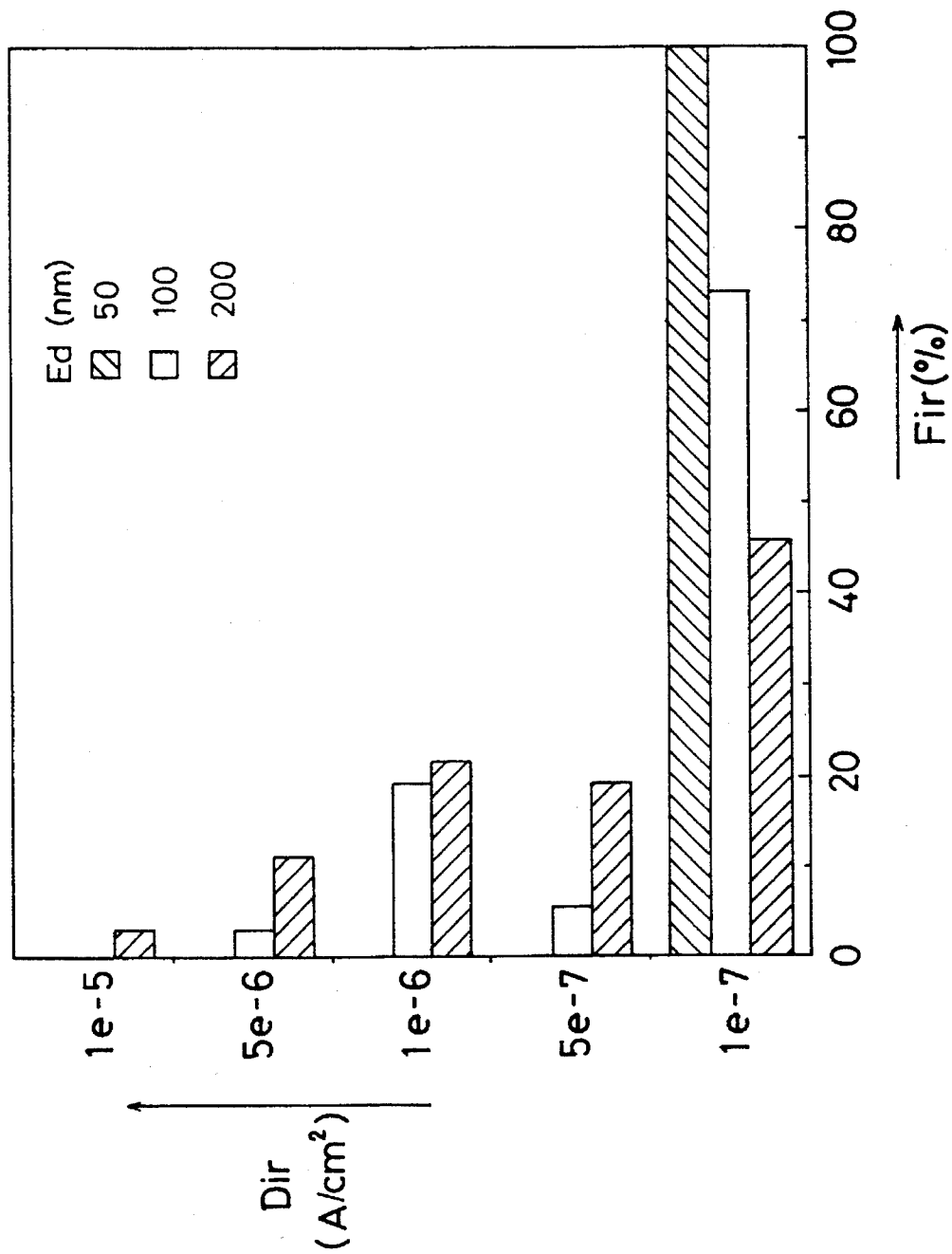
FIG. 4 is a histogram showing frequency of junction leakage current with respect to etched depth of the silicon substrate.

FIG. 4 is a histogram showing a distribution of occurrence rate Fir (%) of each junction leakage current with respect to the etched depth Ed of the silicon substrate 101 at the isolation oxide layer 110, wherein the junction leakage current is expressed as Junction leakage current density Dir (A/cm$^2$). The measurement is conducted under the application of 3.3 V reverse bias voltage. As can be seen from the figure, when the etched depth Ed of the silicon substrate is 50 nm, the junction leakage current density Dir is stably converged at $1\times10^{-7}$(A/cm$^2$) with no junction leakage more than $5\times10^{-7}$(A/cm$^2$). When the etched depth Ed thereof is equal to or more than 100 nm, the junction leakage current density Dir is widely distributed (more than one-digit distribution according to a measured chip). The junction leakage current in the isolation of the DRAM memory cell must be restricted in order to ensure a DRAM pause time characteristic. For example, in a 256M-DRAM, the junction leakage current density Dir must not exceed $1\times10^{-6}$(A/cm$^2$). In addition, the distribution of Junction leakage current density more than one digit causes lowering of yield. Accordingly, the etched depth Ed of the silicon substrate is preferably set to be not exceeding 100 nm.

Figure 5:
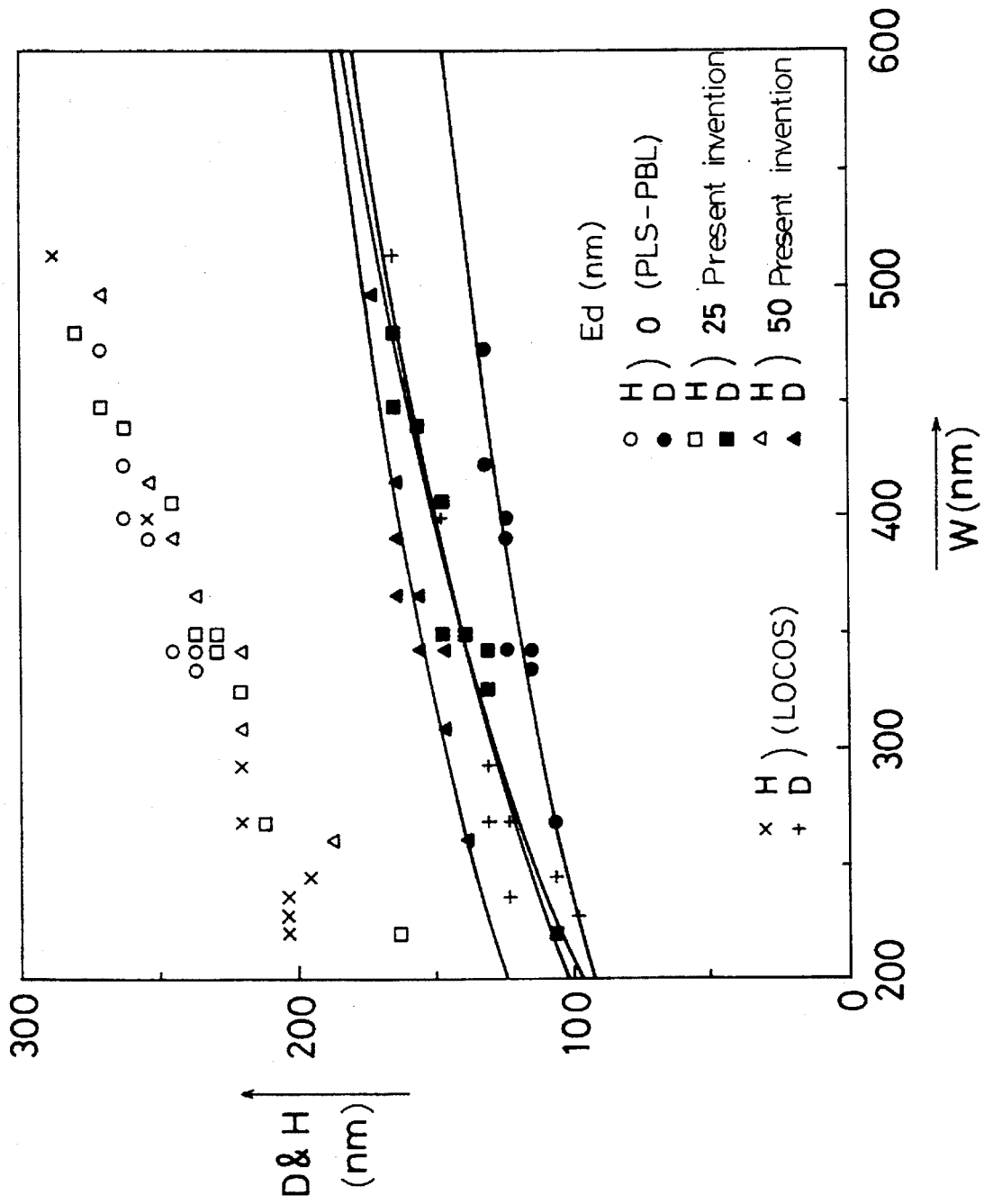
FIG. 5 is a graph showing dependencies of the encroaching length of an isolation oxide layer in a depth direction of the substrate on etched amount of the silicon substrate and width of the isolation.

FIG. 5 shows variation of an encroaching depth D of the isolation oxide layer 110 in a depth direction according to the etched depth Ed of the silicon substrate, a width W of the isolation region Rse and a thickness H of the isolation oxide layer 110, wherein each data in FIG. 5 is obtained by an experiment with respect to the etched depth Ed.

As can be seen from FIG. 5, the thickness H of the isolation oxide layer 110 depends on only the width W of the isolation region Rse, independent from the isolation forming method, and decreases as the width W thereof decreases.

The encroaching depth D of the isolation oxide layer 110 in the depth direction depends on the isolation forming method. In comparison, the encroaching depth D of the isolation oxide layer 110 in the depth direction according to the conventional RLS-PBL method is shorter than that according to conventional LOCOS method. In other words, the isolation characteristic of the isolation oxide layer 110 according to the RLS-PBL method is deteriorated. On the contrary, in the isolation forming method according to the present invention, the encroaching depth D of the isolation oxide layer 110 in the depth direction is almost the same as that according to the LOCOS method by etching by the etched depth Ed of 25 nm of the silicon substrate and is more than that according to the LOCOS method by etching by the etched depth Ed of 50 nm thereof. In other words, the pattern is micro-fabricated, while enhancing the isolation characteristic.

An excessively large etched depth Ed of the silicon substrate produces a large step difference at an interface between the isolation region Rse and the active region Rac. In case where a gate electrode is provided at the step part and a voltage is applied to the gate electrode, an electric field from the surface and sides is applied to the step part and a channel is formed at only the active region Rac adjacent to the isolation region Rse even with application of low gate voltage. As a result, the transistor is made a double threshold type transistor which is in ON state even at application of low gate voltage. The double threshold type transistor causes a drop of the threshold voltage in sub-threshold characteristic, which involves deterioration of OFF characteristic of the transistor. In order to prevent the drop of the threshold, an impurity for the channel stop (boron ion in n-channel transistor) may be implanted at the side parts of the active region Rac. However, since the diffusion coefficient of the impurity is larger than that of the oxide, the impurity is diffused in the active region Rac during the oxidation for forming isolation. In general, many kinds of transistors are formed within a device on the silicon substrate and the gate width, i.e. the channel width is wide (several micrometers) at the peripheral circuits. However, the channel width at the memory cell is about 0.3 μm, which is ten times narrower than that at the peripheral circuits. At a micro-fabricated active region Rac, as well as the transistor at the memory cell part, a narrow-channel effect that the threshold of the transistor is excessively increases is caused, so that high driving voltage is required. This means hard to practically micro-fabricate the transistor.

Generally, when a channel is formed by removing a region at which an isolation is to be formed, as indicated in Table 1, merits and demerits with respect to the characteristics of the transistor to be formed in the active region depend on cases where the channel depth is one third of the thickness of the isolation oxide layer 110 as in each embodiment and where the channel depth is about 0.4–0.6 times of the thickness of the isolation oxide layer as disclosed in the above-mentioned reference No. 63-217640. In Table 1, ○ means comparatively excellent characteristic, ⊙ means much excellent characteristic and x means poor characteristic.

TABLE 1

| restricting effect to | etched depth to isolation | |
|---|---|---|
| | not exceed ⅓ | 0.4–0.6 times |
| bird's beak | ○ | ⊙ |

TABLE 1-continued

| restricting effect to | etched depth to isolation | |
|---|---|---|
| | not exceed ⅓ | 0.4–0.6 times |
| junction leakage current | ⊙ | X |
| drop of threshold | ⊙ | X |
| punch-through | ○ | ⊙ |
| narrow-channel effect | ○ | X |

As indicated in Table 1, in case where the etched depth Ed is 0.4–0.6 times of thickness of the isolation, excellent restricting effect is displayed to the bird's beak and the punch-through, while the restricting effect is lowered to the junction leakage current and lowering of the threshold.

Accordingly, in order to prevent the drop of the threshold, the etched depth Ed of the silicon substrate should be less than about one third of the thickness H of the isolation oxide layer 110.

Figure 6:
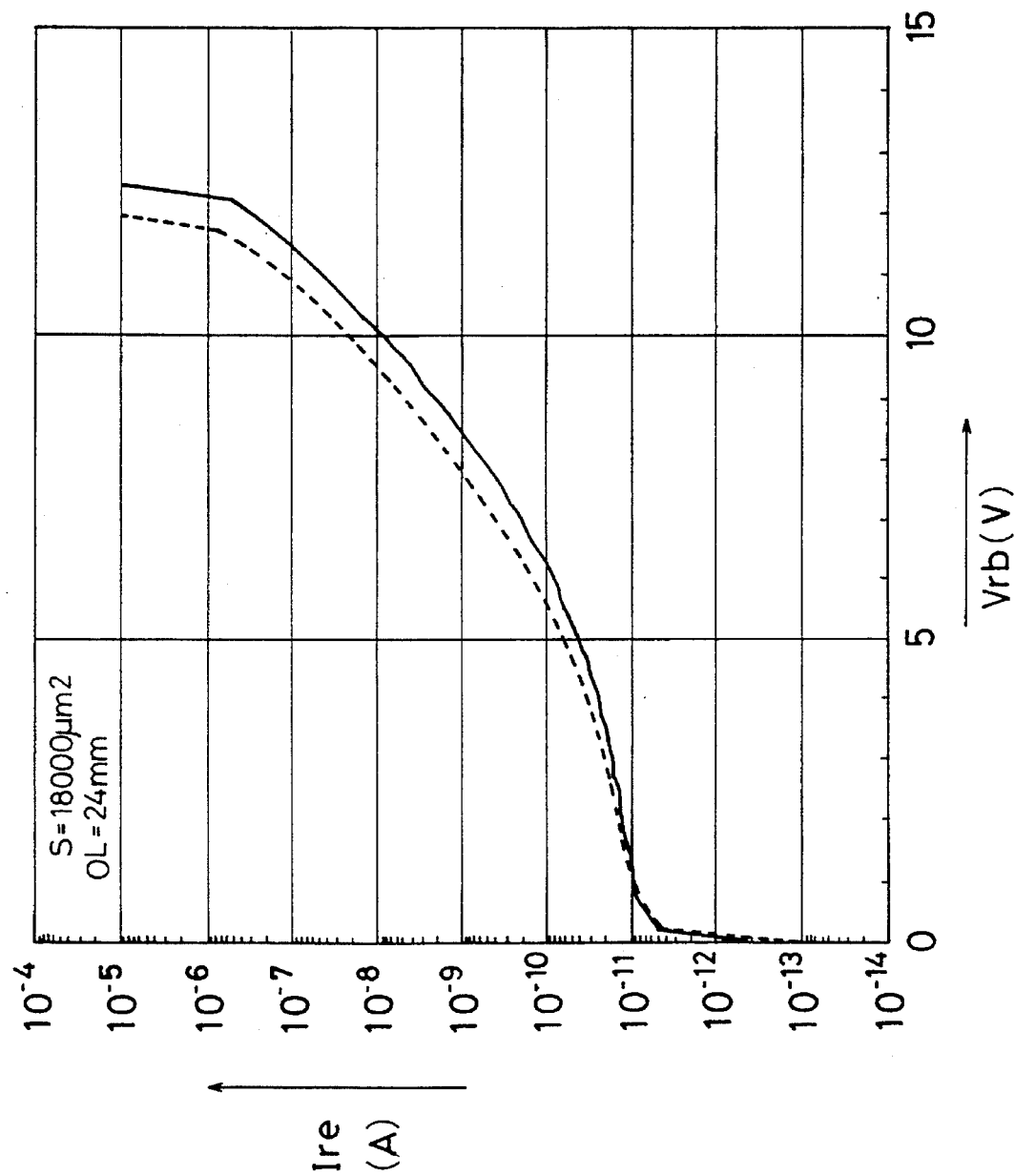
FIG. 6 is a graph showing a comparison of the present invention with a conventional example in a characteristic of junction leakage current with respect to a reverse bias voltage at a p-n junction.

FIG. 6 shows a junction leakage current Ire at a p-n junction in case with isolation according to the first embodiment of the present invention. In comparison, the isolation is formed according to the conventional LOCOS method shown in FIG. 13 with the thick underlaid oxide layer (10 nm) and the thin silicon nitride layer (160 nm) under conditions that the bird's beak is produced and that little stress is applied into the silicon substrate during the oxidation for forming isolation with little crystal defect caused. The p-n junction leakage current Ire is measured at a junction between an $n^+$ diffused layer and the substrate. The area S of the $n^+$ diffused layer and the peripheral length OL is 18000 $\mu m^2$ and 24 mm respectively. No difference in the junction leakage current Ire is found between the isolation (solid line in FIG. 6) according to the present invention and that (broken line in FIG. 6) according to the conventional method. Namely, the isolation oxide layer 110 can be formed according to the present invention without increase in junction leakage current Ire and crystal defect due to application of stress into the silicon substrate.

Figure 7:
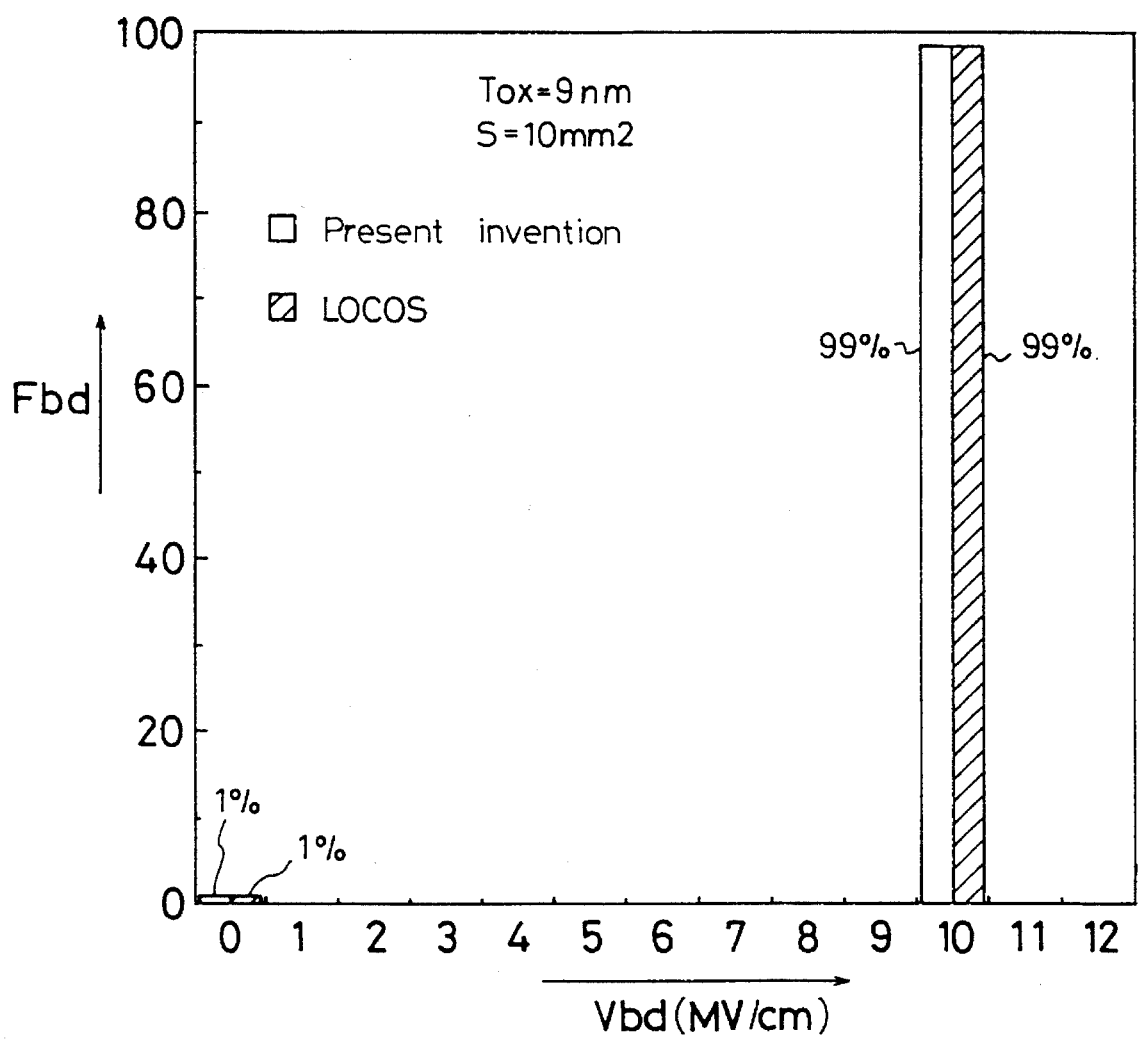
FIG. 7 is a graph showing a comparison of the present invention with the conventional example with respect to durability to high voltage of gate oxide layer.

FIG. 7 shows a durability to high voltage of a gate oxide layer in case where the gate oxide layer is formed at the active region Rac on the silicon substrate 101 after forming the isolation according to the present invention, wherein an axis of abscissa indicates breakdown electric field Vbd and an axis of ordinate indicates breakdown frequency Fbd. In comparison, the isolation is formed according to the conventional LOGOS method shown in FIG. 13 with the thick underlaid oxide layer (50 nm) and the thin silicon nitride layer (120 nm) under conditions that the bird's beak is produced and that no excessive thinning of the gate oxide layer at a LOCOS edge part due to stress into the silicon substrate is caused during the oxidation for forming isolation. Measured samples have the gate oxide layer of 9 nm thickness Tox and the capacitor area S of 10 $mm^2$. No difference in the durability to high voltage of gate oxide layer is found between the present invention and the conventional one. In case with the isolation according to the present invention, it is confirmed according to an evaluation on lowering of durability to high voltage of the gate oxide layer that no thinning of the gate oxide layer due to the stress into the silicon substrate 101 is caused.

Figure 8:
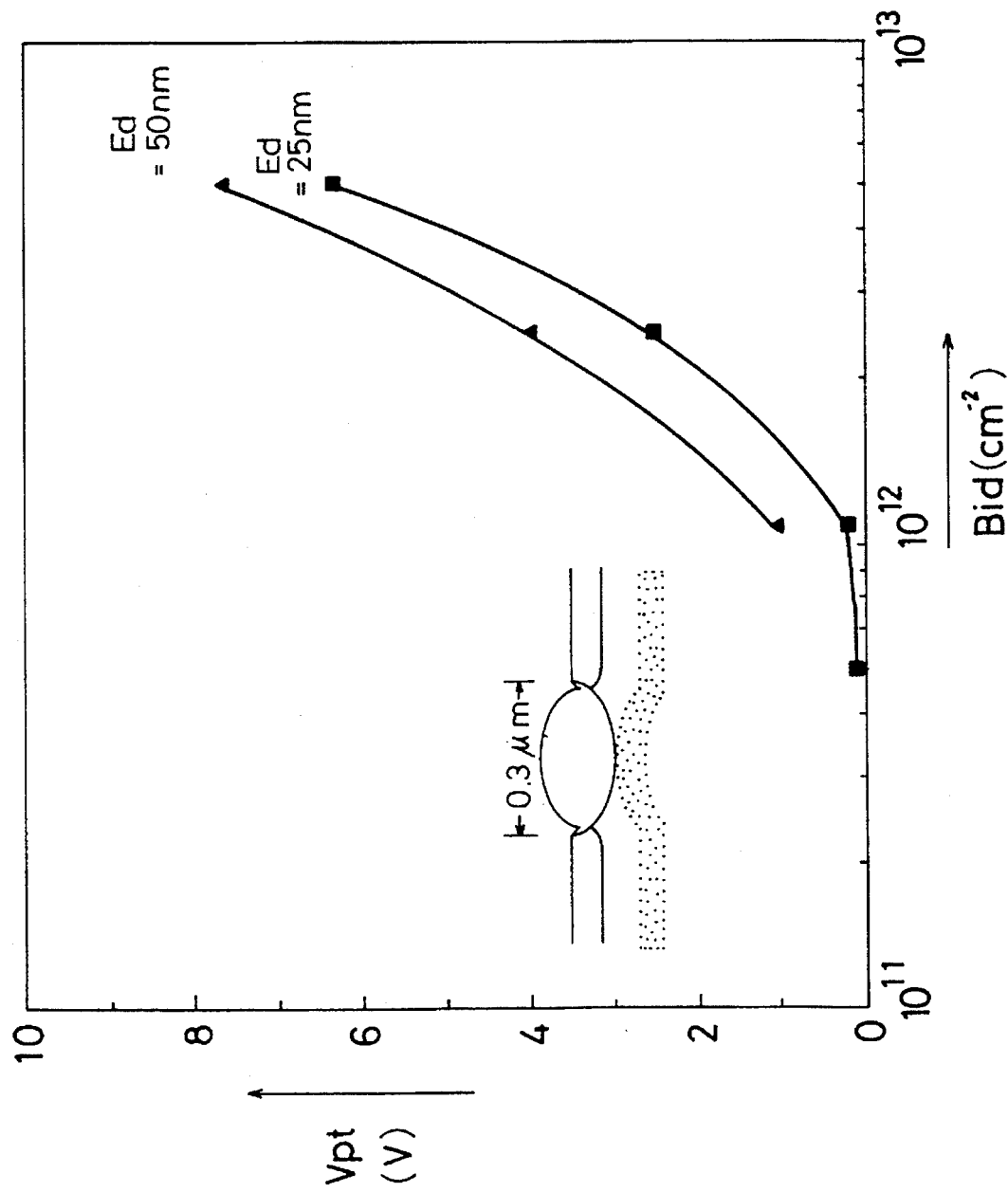
FIG. 8 is a graph showing experimental data regarding variation of voltage at punch-through occurrence with respect to a boron ion implanting dose in an n-channel parasitic MOS transistor.

In FIG. 8, the isolation characteristic of an n-channel parasitic MOS transistor is evaluated with respect to voltage Vpt at which punch-through is produced. As described above, the encroaching depth D of the isolation oxide layer 110 in the depth direction is increased as the increase in the etched depth Ed of the silicon substrate. The punch-through occurrence voltage Vpt is high and isolation characteristic is excellent as the encroaching depth D of the isolation oxide layer 110 in the depth direction is large. The punch-through occurrence voltage Vpt can be made high by increasing implanting dose Bid of boron ion for preventing the punch-through. Wherein, since increase in the boron ion implantation dose Bid involves increase in junction leakage current, the boron ion implantation dose Bid must be restricted to low. The boron ion implantation energy in this experiment is 80 KeV. As shown in FIG. 8, with 50 nm etched depth Ed of the silicon substrate and $5 \times 10^{12}$ cm$^{-2}$ boron ion implantation dose, the punch-through occurrence voltage Vpt is higher than a target value, 7 V, which ensures the excellent characteristic.

Figure 9:
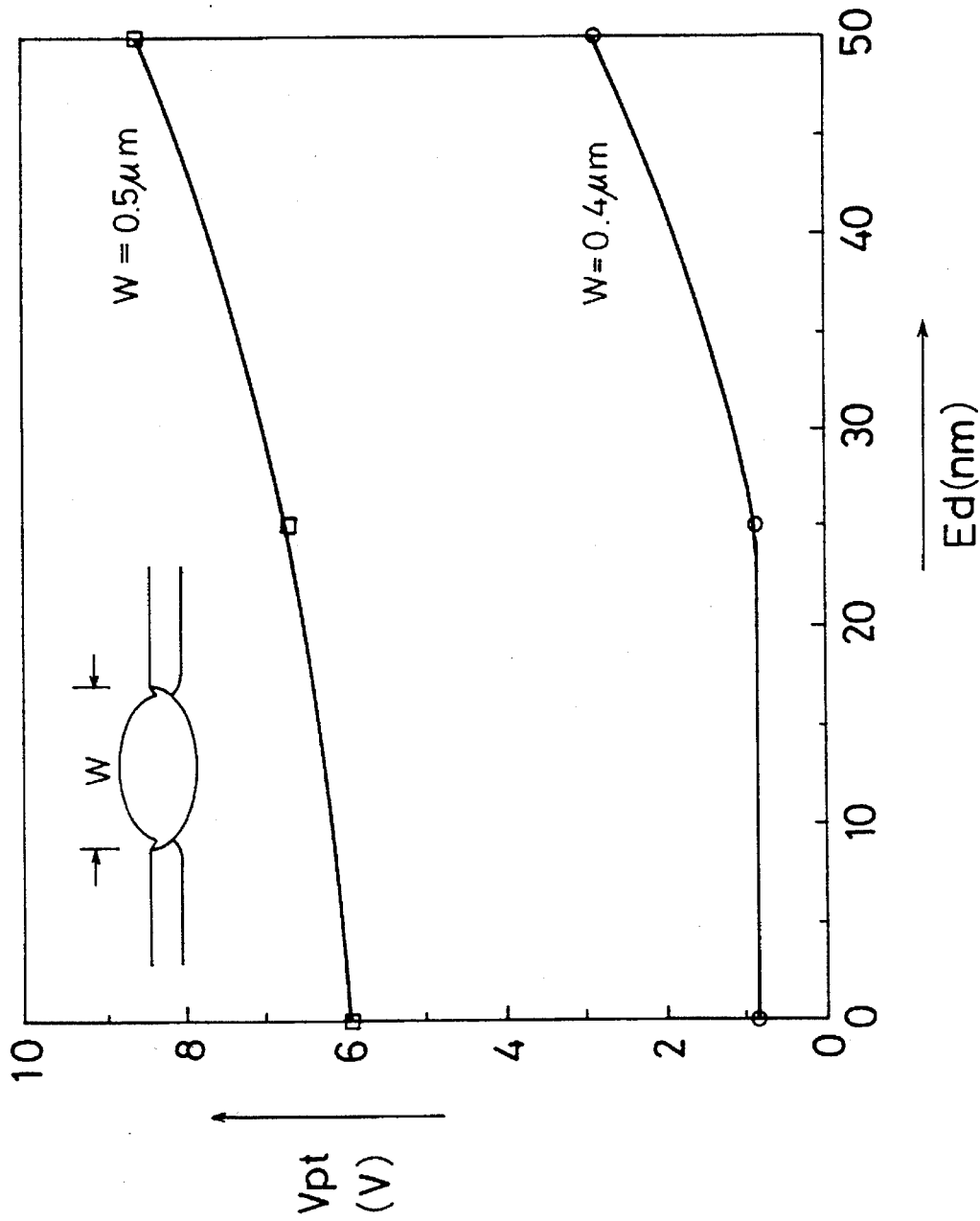
FIG. 9 is a graph showing experimental data regarding variation of voltage at punch-through occurrence with respect to etched amount of silicon substrate of a p-channel parasitic MOS transistor to which phosphorus ion is implanted.

In FIG. 9, the isolation characteristic of a p-channel parasitic MOS transistor is evaluated with respect to the punch-through occurrence voltage Vpt. As well as in the case of the n-channel parasitic MOS transistor, the encroaching depth D of the isolation oxide layer 110 in the depth direction is increased as the etched depth Ed is increased. Phosphorus ion is implanted for preventing punch-through in this experiment under conditions of 200 KeV implantation energy and $4 \times 10^{12}$ cm$^{-2}$ implantation dose Pid. With the isolation region Rse of 0.5 μm width W, the punch-through occurrence voltage Vpt is ensured to equal to or more than 7 V only when the etched depth Ed of the silicon substrate is equal to or more than 30 nm, thus obtaining the excellent characteristic.

The sub-threshold characteristic of the transistor is discussed next.

Figure 10:
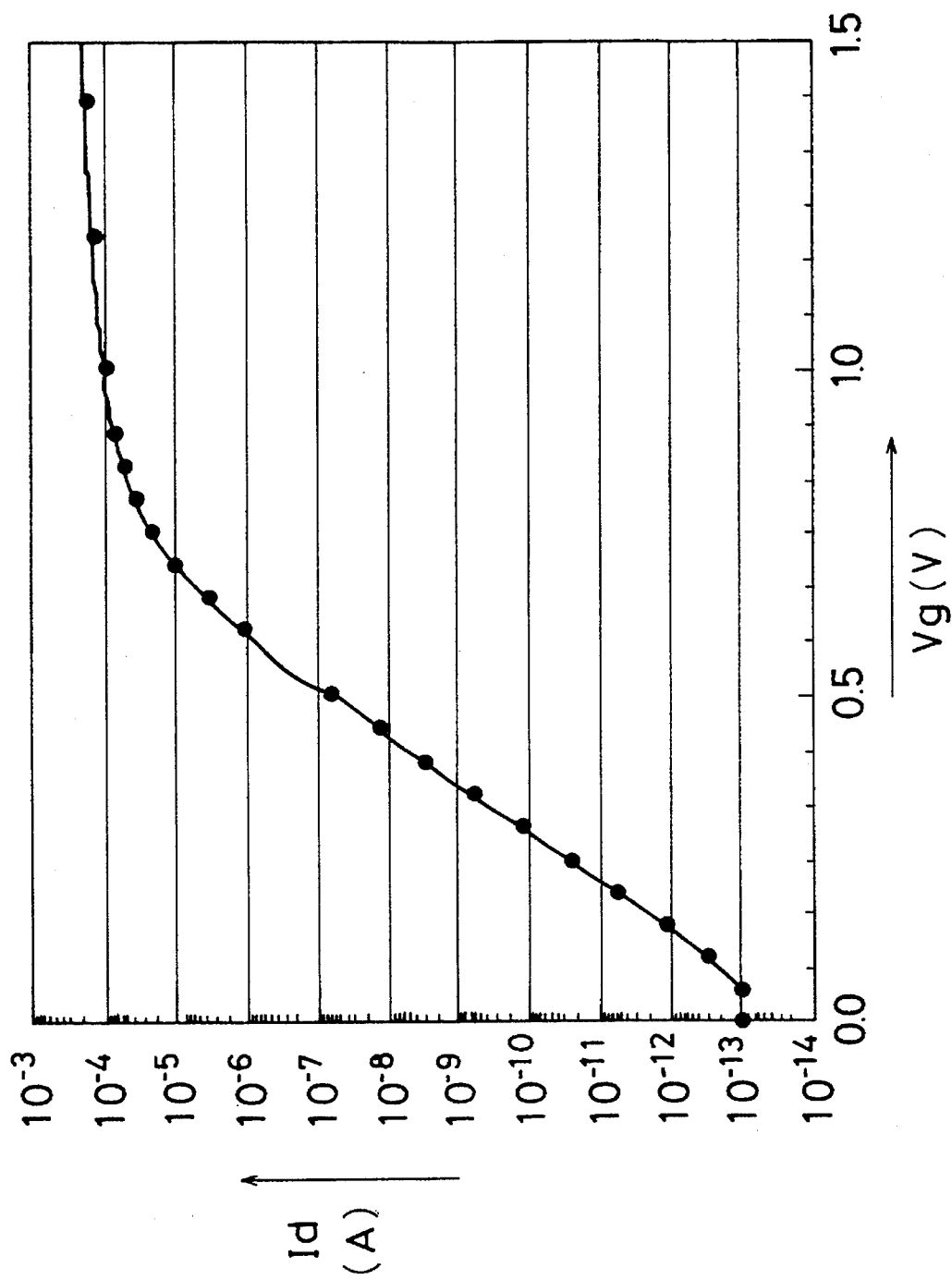
FIG. 10 is a graph showing a sub-threshold characteristic in the n-channel MOS transistor.

FIG. 10 shows the sub-threshold characteristic in case where an n-channel MOS transistor is formed on the silicon substrate on which the isolation according to the first embodiment in the present invention is formed. The gate width Gwd and the gate length Glg of the transistor are 0.3 μm and 1 μm respectively. With the MOS transistor according to the present invention, the characteristic of double threshold type transistor in which the drop of the threshold voltage occurs in the sub-threshold characteristic is not displayed even without boron ion implant for channel stop to the side parts of the active region Rac at the formation of the isolation. Namely, in the present invention, an excellent MOS transistor is obtained without narrow-channel effect and additional manufacturing steps due to implant of the ion boron to the side parts of the active region Rac.

FIGS. 11(a), (b) show results of a detailed experiment for studying influences to the sub-threshold characteristic of the transistor according to the etched depth Ed, wherein FIG. 11(a) shows the sub-threshold characteristic with 50 nm etched depth Ed of the silicon substrate and FIG. 11(b) shows that with 100 nm etched depth Ed thereof. A substrate bias voltage Vg is changed per 0.5 V from 0 V to −2.0 V. In both figures, the gate width Gwd and the gate length Glg are respectively 1 μm, an axis of abscissa indicates gate voltage Vg, an axis of ordinate indicates drain current Id. The drop of the threshold is not shown in case with 50 nm etched depth Ed of the silicon substrate, (FIG. 11(a)) and the drop of the threshold voltage is shown as increase in the substrate bias voltage Vb in case with 100 nm etched depth Ed of the silicon substrate (part encircled by a dot-dash-line in FIG. 11(b)). The lowering of the threshold involves lowering of OFF characteristic of the transistor as mentioned above. However, with less than 100 nm etched depth Ed of the silicon substrate, the drop of the threshold voltage hardly occurs.

In FIG. 12 the drop of the threshold is evaluated with respect to the narrow-channel characteristic with the etched depth Ed of the silicon substrate changed to 0 nm, 25 nm, 50 nm and 100 nm, wherein an axis of abscissa indicates a gate width Gwd of the transistor, an axis of ordinate indicates variation amount Vcv of the threshold. Little problem is involved in the transistor with not exceeding 50 nm etched depth Ed when the threshold variation amount Vcv is not exceeding 0.1 V. In the transistor with 100 nm etched depth Ed, the threshold variation amount Vcv is 0.22 V which means that inverse narrow-channel effect is severe. In general 10–20% threshold variation amount Vcv involves no problem, and over 10–20% threshold variation amount Vcv causes inaccurate estimation of current of the transistor at designing. Accordingly, accurate synchronous operation to clock signals is difficult in a device such as a memory, a processor. In other words, device design cannot be carried out practically. Ordinarily, the threshold is about 0.7 V, and threshold variation amount Vcv is about 10–20% of the threshold when the threshold variation amount Vcv is not exceeding 0.15 V. As can be cleared from FIG. 12, when the etched depth Ed of the silicon substrate is less than 100 nm, the drop of the threshold is restricted sufficiently even in the transistor with micro gate width Gwd of about 0.5 μm. As found from the evaluation of the narrow-channel characteristic, little problem is caused in case with less than 100 nm etched depth Ed of the silicon substrate.

Described next is influence of the nitride side wall 109 to the bird's beak, which is varied in accordance with the thickness of the nitride side wall 109 in FIG. 1(g) or FIG. 2(g).

FIG. 13 shows the variation in thickness of the first underlaid oxide layer 102 at the active region edge with respect to the thickness of the nitride side wall 109. Wherein, the widths L & S of the active region are respectively 0.3 μm and 0.35 μm. The thickness of the first underlaid oxide layer 109 means increased thickness due to generation of bird's beak, as shown in FIG. 14. As shown in FIG. 13, the first underlaid oxide layer 102 increases its thickness as the nitride side wall 109 is thin, and the first underlaid oxide layer 102 is remarkably thinned when the nitride side wall 109 is more than 25 nm in thickness. FIG. 14 is a section of the substrate at the process of FIG. 1(h), wherein the second underlaid oxide layer between the nitride side wall and the polysilicon layer is not shown for the convenience sake. FIG. 15 shows the variation in length of bird's beak with respect to the thickness of the nitride side wall of the second nitride layer in the case where the width of the active region is 0.35 μm. As understood from FIG. 15, when the nitride side wall 109 is 25 nm in thickness, the length of the bird's beak is remarkably reduced.

FIGS. 16(a)–16(c) are sections each showing the substrate at the etching to the first underlaid oxide layer 102 after the formation of the isolation oxide layer 110 and the removal of the nitride side wall 109, the first silicon nitride layer 104 and the polysilicon layer 103, wherein only the part of the isolation oxide layer 110 and the first underlaid oxide layer 102 is shown for easy understanding. FIG. 16(a) shows the substrate before etching to the first underlaid oxide layer 102, FIG. 16(b) shows the substrate in which the bird's beak remains after the removal of the first underlaid oxide layer 102, which is thick, by etching. This bird's beak narrows the width of the active region. FIG. 16(c) shows the substrate in which the nitride side wall 109 in FIG. 16(b) is overetched, which reduces the thickness of the isolation oxide layer 110. In this way, if the bird's beak is completely removed by overetching when the first underlaid oxide layer 102 is reduced in thickness by the bird's beak, the isolation oxide layer 110 is reduced in thickness, which may cause lowering of threshold voltage of the transistor. Also, the etched amount of the first underlaid oxide layer 102 becomes hard to control as the thickness of the first underlaid oxide layer 102 is increased in thickness by the bird's beak. This point is discussed below.

FIGS. 17(a) and 17(b) show the relationships between the etched amount of the oxide layer and the remaining bird's beak in cases of nitride side walls 109 of 30 nm and 15 nm in thickness. As shown in FIG. 17(a), in the case of the nitride side wall 109 of 30 nm in thickness, the remaining bird's beak can be decreased to be ignored when the etched amount of the oxide layer is 20 nm (i.e. 10 nm overetching amount). On the other hand, as shown in FIG. 17(b), in the case of the nitride side wall 109 of 15 nm in thickness, the remaining bird's beak can be decreased to be ignored when the etched amount of the oxide layer is 30 nm (i.e. 20 nm overetching amount).

FIGS. 18(a) and 18(b) show the dispersion in length of the remaining bird's beaks when the oxide layer is etched for regulating the length of the remaining bird's beaks shown in FIGS. 17(a), 17(b). Wherein, the dispersion in length of the remaining bird's beak is described in a case where the dispersion of overetching at the removal of the first underlaid oxide layer 102 is 20% (±10%). As shown in FIG. 18(a), when the nitride side wall 109 is 30 nm in thickness, 10 nm overetching causes 5.14% dispersion in length of bird's beak with respect to the active region of 0.35 µm width, which causes 5.14% dispersion of current of the transistor. When the nitride side wall 109 is 15 nm in thickness, 20 nm overetching causes 8.57% dispersion in the length thereof, which causes 8.57% dispersion of current of the transistor because the width of the active region is directly proportional to the saturation current of the transistor. Namely, when the nitride side wall 109 is thin, the dispersion in width of the transistor formed in the active region becomes large because of the large dispersion of length in the remaining bird's beak. Also, the dispersion of electric characteristic of the transistor, especially the dispersion of saturation current is large. The decrease in saturation current lowers the processing speed of logical circuit and degrades the performance of integrated circuit. Though the saturation current value of the transistor is normally managed within a dispersion range of 104 the dispersion of 8.57% involves serious problems because the dimensional dispersions in photo-lithography and dry etching overlaps the dispersion of etching to the oxide layer. Such a problem is discussed next.

In general, a total dispersion (c) of two kinds of dispersions (a, b) is expressed by the following equation:

$$c=\sqrt{(a+b)}$$

Using the equation, allowance of the dispersion at photo-lithography and dry etching is evaluated from the dispersion (a) due to over-etching for removing the first underlaid oxide layer 102 with 0.35 µm active region.

When the thickness of nitride side wall is 30 nm, the dispersion due to wet etching is ±0.009 µm, so that:

$$0.035=\sqrt{(0.018^2+b^2)}, b=0.030$$

which results in ±0.015 µm allowance.

When the thickness of nitride side wall is 15 nm, the dispersion due to wet etching is ±0.015 µm, so that:

$$0.035=\sqrt{(0.030^2+b^2)}$$

which results in ±0.009 µm allowance.

As descried above, in the case where the decrease in thickness of nitride side wall increases the length dispersion of remaining bird's beak of the first underlaid oxide layer 102 due to overetching, the allowance of dispersion at the photo-lithography and dry etching is decreased from ±0.015 µm to ±0.009 µm. The ±0.009 µm allowance requires not exceeding 5% dispersion, which is substantially impossible, taking account of mass products. Therefore, in order to ensure not exceeding 10% dispersion of saturation current, the dispersion of overetching to the oxide layer must be not more than 5% and the thickness of the nitride side wall must be about 30 nm, or no less than 25 nm.

In first and second embodiments, the first underlaid oxide layer 102 is formed by oxidizing the silicon substrate 101, but may be formed by depositing a CVD oxide layer.

Also, in first and second embodiments, the polysilicon layer 103 is formed for serving as a silicon layer for buffering stress and absorbing oxide. An amorphous silicon layer instead of the polysilicon layer can serve as the same functions.

In the second embodiment, the thickness-keeping oxide layer 111 is removed by wet etch, but may be removed by dry etch.

An impurity for forming punch-through stopper is implanted to the silicon substrate before the formation of the polysilicon layer and the first silicon nitride layer in general methods, but is implanted after formation of the isolation in each embodiment. Wherein, the impurity for forming punch-through stopper is not necessarily implanted thereto.

We claim:

1. A method of forming an isolation for isolating an active region at which a FET to be formed from other regions on a surface of a silicon substrate, comprising the steps of:

forming a first underlaid oxide layer by oxidizing the silicon substrate;

forming a silicon layer on the first underlaid oxide layer;

forming a first silicon nitride layer on the silicon layer;

removing a portion of the silicon substrate at which an isolation is to be formed to a depth which regulates an encroaching length of bird's beak of the isolation to the active region and a drop of a threshold voltage of the FET to be formed by etching the first silicon nitride layer, the silicon layer, the first underlaid oxide layer and the silicon substrate, using a mask of pattern whose aperture corresponds to the isolation region;

oxidizing the silicon substrate and the silicon layer to form a second underlaid oxide layer on surfaces thereof;

forming a second silicon nitride layer entirely over the substrate on which the second underlaid oxide layer is formed;

anisotropically etching the second silicon nitride layer so as to remove at least the second silicon nitride layer in a region at which the isolation region is to be formed and so as to leave silicon nitride side walls of more than 25 nm in thickness which are made of the second silicon nitride layer at a side part of the first silicon nitride layer, at a side part of the silicon layer, and at a side part of a step part of the silicon substrate;

forming the oxide layer to be the isolation by selectively oxidizing the silicon substrate, using as a mask the first silicon nitride layer and the second silicon nitride layer;

removing the first and second silicon nitride layers and the silicon layer after the formation of the oxide layer to be the isolation; and removing the first underlaid oxide layer by etching.

2. A method of forming an isolation for isolating an active region at which a FET to be formed from other regions on a surface of a silicon substrate, comprising the steps of:

forming a first underlaid oxide layer by oxidizing the silicon substrate;

forming a silicon layer on the first underlaid oxide layer;

forming a first silicon nitride layer on the silicon layer;

forming a thickness-keeping oxide layer on the first silicon nitride layer;

removing a portion of the silicon substrate at which an isolation is to be formed to a depth which regulates an encroaching length of bird's beak of the isolation and a drop of a threshold voltage of the FET to be formed by etching the thickness-keeping oxide layer, the first silicon nitride layer, the silicon layer, the first underlaid oxide layer and the silicon substrate, using a mask of a pattern whose aperture corresponds to the isolation region;

oxidizing the silicon substrate and the silicon layer to form a second underlaid oxide layer on surfaces thereof;

forming a second silicon nitride layer entirely over the substrate on which the second underlaid oxide layer is formed;

anisotropically etching the second silicon nitride layer so as to remove at least the second silicon nitride layer in the isolation region and so as to leave silicon nitride side walls of more than 25 nm in thickness which are made of the second silicon nitride layer at a side part of the first silicon nitride layer, at a side part of the silicon layer, and at a side part of a step part of the silicon substrate;

forming the oxide layer to be the isolation by selectively oxidizing the silicon substrate, using as a mask the first silicon nitride layer and the second silicon nitride layer removing the thickness-keeping oxide layer after the formation of the oxide layer to be the isolation;

removing the first and second silicon nitride layers and the silicon layer; and removing the first underlaid oxide layer by etching.

3. The method of forming an isolation according to claim 1 or 2, wherein in the step of removing the portion of the silicon substrate at which the isolation is to be formed, an upper limit of the depth at the part to be removed is so set that the drop of the threshold voltage of the FET is not exceeding a predetermined value.

4. The method of forming an isolation according to claim 3, wherein in the step of removing the portion of the silicon substrate at which the isolation is to be formed, the upper limit of the depth at the part to be removed is so set that the drop of the threshold voltage of the FET is not exceeding 0.15 V.

5. The method of forming an isolation according to claim 1 or 2, wherein in the step of removing the portion of the silicon substrate at which the isolation is to be formed, a lower limit of the depth at the part to be removed is so set that the length of the bird's beak of the isolation is not exceeding a predetermined value, taking account of a thickness of the oxide layer for isolation.

6. The method of forming an isolation according to claim 5, wherein in the step of removing the portion of the silicon substrate at which the isolation is to be formed, the lower limit of the depth at the part to be removed is so set that the length of the bird's beak of the isolation is not exceeding 0.2 µm, taking account of the thickness of the oxide layer for isolation.

7. The method of forming an isolation according to claim 1 or 2, wherein in the step of removing the portion of the silicon substrate at which the isolation is to be formed, the depth at the part to be removed is set in a range between 20 nm and 100 nm.

8. The method of forming an isolation according to claim 1 or 2, wherein in the step of removing the portion of the silicon substrate at which the isolation is to be formed, an upper limit of the depth at the part to be removed is one third of a thickness of the isolation to be formed.

9. The method of forming an isolation according to claim 1 or 2, further comprising the step of forming an undercut by isotropically etching the first underlaid oxide layer after the step of removing the portion of the silicon substrate at which the isolation is to be formed.

10. The method of forming an isolation according to claim 1 or 2, further comprising the step of implanting an impurity ion for forming a punch-through stopper entirely into the active region and the isolation region after the step of forming the isolation region.

* * * * *